US011632063B1

(12) United States Patent
Ouderkirk et al.

(10) Patent No.: US 11,632,063 B1
(45) Date of Patent: Apr. 18, 2023

(54) STRUCTURED ACTUATORS

(71) Applicant: META PLATFORMS TECHNOLOGIES, LLC, Menlo Park, CA (US)

(72) Inventors: Andrew John Ouderkirk, Redmond, WA (US); Renate Eva Klementine Landig, Seattle, WA (US); Kenneth Diest, Kirkland, WA (US); Sheng Ye, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 177 days.

(21) Appl. No.: 16/552,280

(22) Filed: Aug. 27, 2019

(51) Int. Cl.
*H02N 1/00* (2006.01)
*H01L 41/083* (2006.01)
*G06F 3/01* (2006.01)

(52) U.S. Cl.
CPC .......... *H02N 1/006* (2013.01); *H01L 41/083* (2013.01); *G06F 3/016* (2013.01)

(58) Field of Classification Search
CPC ... H02N 1/006; H01L 41/083; H01L 41/0536; G06F 3/016; H01R 17/00; H01R 17/005
USPC .......................................................... 310/364
See application file for complete search history.

(56) References Cited

U.S. PATENT DOCUMENTS

| | | | | |
|---|---|---|---|---|
| 4,632,856 A * | 12/1986 | Marcus | ................. | H01G 4/186 156/288 |
| 4,633,120 A * | 12/1986 | Sato | ....................... | H02N 2/043 310/328 |
| 5,233,356 A * | 8/1993 | Lee | ......................... | H01Q 21/22 342/368 |
| 5,834,879 A * | 11/1998 | Watanabe | ............. | H01L 41/094 310/328 |
| 5,977,685 A * | 11/1999 | Kurita | .................... | C08G 18/10 310/311 |
| 6,586,859 B2 * | 7/2003 | Kornbluh | ............... | A63H 13/00 310/309 |
| 6,664,718 B2 * | 12/2003 | Pelrine | .................... | F04B 35/00 310/330 |
| 6,813,815 B2 * | 11/2004 | Namerikawa | ....... | H01L 41/0831 29/25.35 |

(Continued)

FOREIGN PATENT DOCUMENTS

EP    1919073    *   7/2008   ............... H02N 1/00

OTHER PUBLICATIONS

"Comparison of EAPs with Other Actuator Technologies", URL: https://ndeaa.jpl.nasa.gov/nasa-nde/lommas/eap/actuators-comp.pdf, as accessed on Feb. 14, 2011, 4 pages.

*Primary Examiner* — Burton S Mullins
(74) *Attorney, Agent, or Firm* — Greenberg Traurig, LLP

(57) ABSTRACT

An actuator assembly includes (i) a first actuator stack having a first primary electrode, a first secondary electrode overlapping at least a portion of the first primary electrode, and a first electroactive layer disposed between and abutting the first primary electrode and the first secondary electrode, (ii) a second actuator stack having a second primary electrode, a second secondary electrode overlapping at least a portion of the second primary electrode, and a second electroactive layer disposed between and abutting the second primary electrode and the second secondary electrode; and (iii) a bonding layer disposed between the first actuator stack and the second actuator stack.

18 Claims, 12 Drawing Sheets

(56) References Cited

U.S. PATENT DOCUMENTS

| | | | |
|---|---|---|---|
| 7,362,889 B2* | 4/2008 | Dubowsky | G01R 33/28 |
| | | | 382/128 |
| 8,148,879 B2* | 4/2012 | Andoh | H04R 17/005 |
| | | | 310/363 |
| 8,384,271 B2* | 2/2013 | Kwon | H01L 41/0833 |
| | | | 310/328 |
| 9,006,345 B2* | 4/2015 | Lancaster | C08F 2/38 |
| | | | 525/275 |
| 9,748,469 B2* | 8/2017 | Lim | H01L 41/193 |
| 9,837,597 B2* | 12/2017 | Sashida | H04R 17/00 |
| 10,409,379 B1* | 9/2019 | Khoshkava | B06B 1/0611 |
| 11,073,913 B2* | 7/2021 | Rinner | H01L 41/0986 |
| 11,079,845 B2* | 8/2021 | Giordano | G06F 3/015 |
| 11,127,547 B1* | 9/2021 | Wang | G06F 1/1684 |
| 11,314,331 B2* | 4/2022 | Schwab | G06F 3/016 |
| 2016/0025429 A1* | 1/2016 | Muir | F04D 33/00 |
| | | | 318/116 |
| 2017/0160798 A1* | 6/2017 | Lanman | G06F 3/04842 |
| 2019/0334077 A1* | 10/2019 | Galler | H01L 41/0474 |
| 2021/0365118 A1* | 11/2021 | Rajapurkar | G06F 3/016 |

\* cited by examiner

STRUCTURED ACTUATORS

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
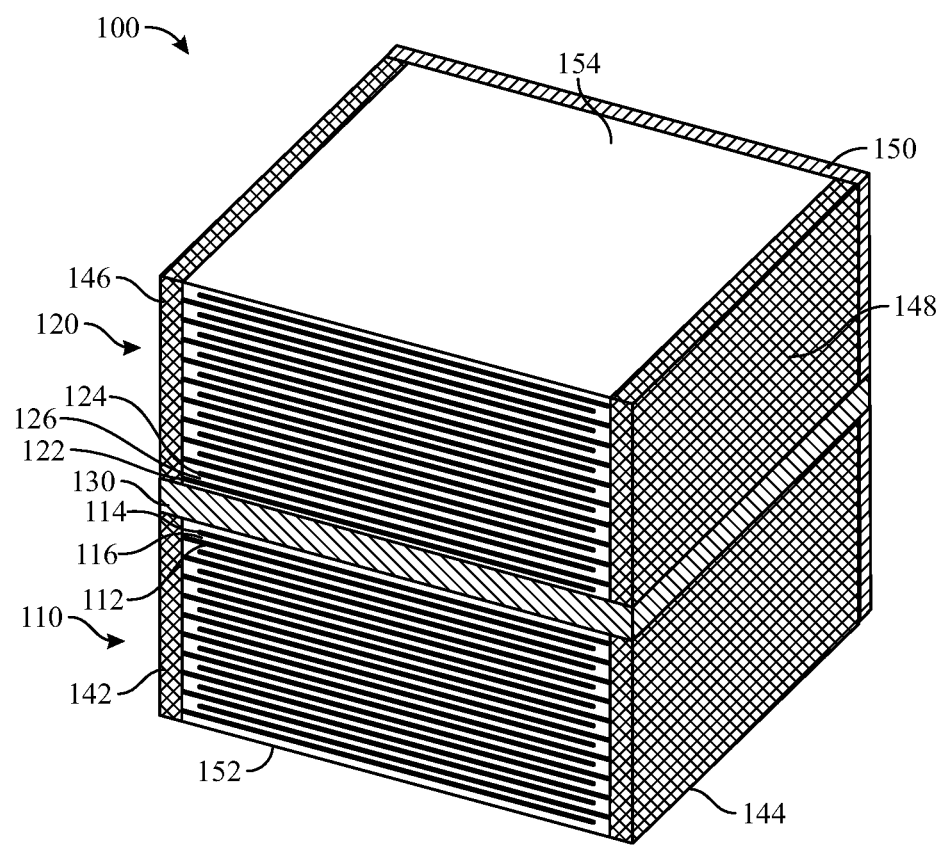
FIG. 1 is a perspective view of an example actuator assembly including a pair of actuator stacks according to various embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Disclosed are geometrically-structured electromechanical devices, including nanovoided polymer-based actuators, that may exhibit a variety of form factors suitable for incorporation into various system architectures. In accordance with various embodiments, the structured actuators may exhibit higher practical energy and power densities than achievable in conventional devices. Furthermore, although many comparative electromechanical devices may generate highly asymmetric output forces, i.e., where a compressive force during actuation may be substantially greater than a corresponding expansive force, the presently-disclosed structured actuators may be configured to exert greater expansive forces without compromising their force output in compression.

The nanovoided polymer-based actuators disclosed herein may include one or more layers of an electroactive polymer disposed between conductive electrodes. Polymer materials may be incorporated into a variety of different optic and electro-optic device architectures, including active and passive optics and electroactive devices. Electroactive polymer (EAP) materials, for instance, may change their shape under the influence of an electric field. EAP materials have been investigated for use in various technologies, including actuation, sensing and/or energy harvesting. Lightweight and conformable, electroactive polymers may be incorporated into wearable devices such as haptic devices and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including the refractive index to manipulate light and/or in the example of electroactive applications, electrostatic forces to generate compression or expansion between conductive electrodes. In some embodiments, the electroactive response may include a mechanical response to an electrical input that varies over the spatial extent of the device, with the electrical input being applied by a control circuit to a layer of electroactive material located between paired conductors. The mechanical response may be termed an actuation, and example devices may be, or include, actuators. In particular embodiments, a deformable optical element and an electroactive layer may be co-integrated whereby the optical element may itself be actuatable. Deformation of the electroactive polymer may be used to actuate optical elements in an optical assembly, such as a lens system. Notwithstanding recent developments, it would be advantageous to provide polymer materials and associated actuator structures having improved characteristics, including a controllable and reversible deformation response.

According to various embodiments, an actuator assembly may include (i) a first actuator stack having a first primary electrode, a first secondary electrode overlapping at least a portion of the first primary electrode, and a first electroactive layer disposed between and abutting the first primary electrode and the first secondary electrode, (ii) a second actuator stack having a second primary electrode, a second secondary electrode overlapping at least a portion of the second primary electrode, and a second electroactive layer disposed between and abutting the second primary electrode and the second secondary electrode; and (iii) a bonding layer disposed between the first actuator stack and the second actuator stack.

In accordance with various embodiments, an electroactive layer may include a layer of a nanovoided polymer material. A nanovoided polymer may include a polymer matrix and a plurality of nanoscale voids dispersed throughout the matrix. The polymer matrix material may include a deformable, electroactive polymer such as polydimethylsiloxane (PDMS), acrylates, or poled polyvinylidene fluoride (PVDF) or its co-polymers such as poly(vinylidenefluoride-co-trifluoroethylene) (PVDF-TrFE)). Such materials, according to some embodiments, may have a dielectric constant or relative permittivity, such as, for example, a dielectric constant ranging from approximately 1.2 to approximately 30 or more.

Example nanovoided polymer materials may include silicone-based polymers, such as poly(dimethyl siloxane), and acrylic polymers, such as ethyl acrylate, butyl acrylate, octyl acrylate, ethoxyethoxy ethyl acrylate, chloromethyl acrylate, methacrylic acid, dimethacrylate oligomers, allyl glycidyl ether, fluorinated acrylates, cyanoacrylate or N-methylol acrylamide. Further example nanovoided polymer materials may include silicone acrylate polymers, and urethane polymers, as well as mixtures of the foregoing. The nanovoided polymer may include an elastomer or a thermoset polymer, for example.

As used here the terminology "nanovoids," "nanoscale voids," "nanovoided," and the like, may refer to voids having at least one sub-micron dimension, i.e., a length and/or width and/or depth, of less than 1000 nm. In some embodiments, the void size may be between approximately 5 nm and approximately 1000 nm (e.g., approximately 5 nm, approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, approximately 1000 nm, approximately 2000 nm, approximately 5000 nm, or approximately 10,000 nm, including ranges between any of the foregoing values).

In example nanovoided polymer materials, the nanovoids may be randomly distributed throughout the polymer matrix, without exhibiting any long-range order, or the nanovoids may exhibit a regular, periodic structure having a regular repeat distance of approximately 20 nm to approximately 1000 nm. In both disordered and ordered structures, the nanovoids may be discrete, closed-celled voids, open-celled voids that may be at least partially interconnected, or combinations thereof. For open-celled voids, the void size (d) may be the minimum average diameter of the cell. The voids may be any suitable size and, in some embodiments, the voids may approach the scale of the thickness of a nanovoided polymer layer.

In certain embodiments, the nanovoids may occupy approximately 1% to approximately 90% by volume of the nanovoided polymer matrix, e.g., approximately 1%, approximately 2%, approximately 5%, approximately 10%, approximately 20%, approximately 30%, approximately 40%, approximately 50%, approximately 60%, approximately 70%, approximately 80%, or approximately 90%, including ranges between any of the foregoing values.

According to some embodiments, the nanovoids may be substantially spherical, although the void shape is not particularly limited. For instance, in addition to, or in lieu of spherical voids, the nanovoided polymer material may include voids that are oblate, prolate, lenticular, ovoid, etc., and may be characterized by a convex and/or a concave cross-sectional shape. The void shape may be isotropic or anisotropic. Moreover, the topology of the voids throughout the polymer matrix may be uniform or non-uniform. As used herein "topology" with reference to the nanovoids refers to their overall arrangement within the nanovoided polymer matrix and may include their size and shape as well as their distribution (density, periodicity, etc.) throughout the polymer matrix. By way of example, the size of the voids and/or the void size distribution may vary spatially within the nanovoided polymer material, i.e., laterally and/or with respect to a thickness of a nanovoided polymer layer. The voids may also have a deterministic structure, including for example, posts or rib-like structures. The posts or ribs may have orthogonal or non-orthogonal angles, including slanted or tapered angles, as well as combinations thereof.

According to various embodiments, the nanovoids may be distributed homogeneously or non-homogeneously. By way of example, the size of the voids and/or the void size distribution may vary spatially within the nanovoided polymer material, i.e., laterally and/or with respect to the thickness of a nanovoided polymer layer. In a similar vein, a nanovoided polymer layer may have a constant density of nanovoids or the density of nanovoids may increase or decrease as a function of position, e.g., thickness. Adjusting the void fraction of an EAP, for instance, can be used to tune its compressive stress-strain characteristics.

In some embodiments, the nanovoids may be at least partially filled with a gas. A gas may be incorporated into nanovoids to suppress electrical breakdown of an electroactive polymer element (for example, during capacitive actuation). The gas may include air, nitrogen, oxygen, argon, sulfur hexafluoride, an organofluoride and/or any other suitable gas. In some embodiments, such a gas may have a high dielectric strength. In some embodiments, the gas composition may be selected to tune the optical properties of the nanovoided polymer, including the scattering, reflection, absorption, and/or transmission of light.

In some embodiments, the application of a voltage to a nanovoided polymer layer may change the internal pressure of gasses within the nanovoided regions thereof. In this regard, gasses may diffuse either into or out of the nanovoided polymer matrix during dimensional changes associated with its deformation. Such changes in void topology can affect, for example, the hysteresis of an electroactive device incorporating the electroactive polymer during dimensional changes, and also may result in drift when the nanovoided polymer layer's dimensions are rapidly changed.

In some embodiments, the nanovoided polymer material may include an elastomeric polymer matrix having an elastic modulus of less than approximately 10 GPa (e.g., approximately 10 GPa, approximately 5 GPa, approximately 2 GPa, approximately 1 GPa, approximately 0.5 GPa, approximately 0.2 GPa, approximately 0.1 GPa, approximately 0.05 GPa, approximately 0.02 GPa, approximately 0.01 GPa, approximately 0.005 GPa, approximately 0.002 GPa, approximately 0.001 GPa, approximately 0.0005 GPa, approximately 0.0002 GPa, or approximately 0.0001 GPa, including ranges between any of the foregoing values).

Polymer materials including voids having nanoscale dimensions may possess a number of advantageous attributes. For example, the incorporation of nanovoids into a polymer matrix may augment the permittivity of the resulting composite. Furthermore, the high surface area-to-volume ratio associated with nanovoided polymers will provide a greater interfacial area between the nanovoids and the surrounding polymer matrix. With such a high surface area structure, electric charge can accumulate at the void-matrix interface, which can enable greater polarizability and, consequently, increased permittivity ($\varepsilon_r$) of the composite. Additionally, because ions, such as plasma electrons, can only be accelerated over small distances within voids having nanoscale dimensions, the likelihood of molecular collisions that liberate additional ions and create a breakdown cascade is decreased, which may result in the nanovoided material exhibiting a greater breakdown strength than un-voided or even macro-voided polymers. In some embodiments, an ordered nanovoid architecture may provide a controlled deformation response, while a disordered nanovoided structure may provide enhanced resistance to crack propagation and thus improved mechanical durability.

As disclosed herein, according to certain embodiments, an inkjet printing method may be used to form nanovoided polymer materials, such as nanovoided polymer thin films or structured layers, although other deposition and coating methods are contemplated. Methods of forming nanovoided polymer thin films or structured layers may include printing a polymer precursor composition containing a solvent, curing the polymer precursor to form a polymer matrix, and then selectively removing the solvent from the polymer matrix.

In accordance with various embodiments, an example method may include (i) printing a mixture (i.e., a polymer precursor composition) including a curable material and at least one solvent onto a substrate, (ii) processing the mixture to form a cured polymer material having solvent in a plurality of defined regions, and (iii) removing at least a portion of the solvent from the cured polymer material to form a nanovoided polymer material on the substrate.

The curable material may include silicones (including those based on polydimethyl siloxanes), acrylates (including polymethyl methacrylate, ethyl acrylate, butyl acrylate, di, tri, and poly functional acrylates for crosslinkers), silicone acrylates, styrenes, urethanes, polyesters, polycarbonates, epoxies, halogenated polymers, imides, olefins, homopolymers, copolymers, block copolymers, as well as combinations thereof. Example solvents may include water and other organic compounds such as alcohols, ketones, esters, ethers, and the like, including mixtures thereof.

According to some embodiments, in addition to a solvent and a curable material, the polymer precursor composition may include one or more of a porogen, polymerization initiator, surfactant, emulsifier, and/or other additive(s) such as cross-linking agents. In some embodiments, various components of the polymer precursor composition may be combined into a single mixture and deposited simultaneously. Alternatively, the various components may be deposited individually (i.e., in succession), or in any suitable combination(s).

In some embodiments, in conjunction with an example inkjet printing method, the polymer precursor composition may include approximately 0.1% to approximately 20% of a low-volatility (i.e., low vapor pressure) liquid adapted to decrease the viscosity of the mixture and inhibit drying and clogging of the inkjet nozzle. The low-volatility liquid may be water miscible and may include, for example, one or more of ethylene glycol, diethylene glycol, benzyl alcohol, dimethylsulfoxide, 1-hexanol, dimethylformamide, cyclohexane, anisole, or acetyl acetone. In certain embodiments, the polymer precursor composition may have a viscosity of between approximately 1 cPs and approximately 30 cPs, e.g., 1, 2, 4, 10, 20, or 30 cPs, including ranges between any of the foregoing values.

The polymer precursor composition may be printed onto any suitable substrate. In some embodiments, the substrate may be transparent. Example substrate materials may include glass and polymeric compositions, which may define various optical element architectures such as a lens. As disclosed herein, further example substrates may include transparent conductive layers, such as transparent conductive electrodes.

In certain embodiments, prior to printing or otherwise depositing the polymer precursor composition, the substrate surface may be pre-treated or conditioned, for example, to improve the wettability or adhesion of the printed layer(s). Substrate pre-treatments may include one or more of a plasma treatment (e.g., $CF_4$ plasma), thermal treatment, e-beam exposure, UV exposure, UV-ozone exposure, or coating with a layer of solvent or a self-assembled monolayer. The substrate pre-treatment may increase or decrease the roughness of the substrate surface. In some embodiments, the pre-treatment may be used to form a hydrophilic surface or a hydrophobic surface.

In various embodiments, the polymer precursor composition may be deposited at approximately atmospheric pressure, although the deposition pressure is not particularly limited and may be conducted at reduced pressure, e.g., from approximately 1 Torr to approximately 760 Torr, e.g., 1, 2, 5, 10, 20, 50, 100, 200, 500, or 760 Torr, including ranges between any of the foregoing values.

During one or more deposition steps, the substrate temperature may be maintained at approximately room temperature (23° C.), although lesser and greater substrate temperatures may be used. For instance, the substrate temperature may range from approximately −20° C. to approximately 100° C., e.g., −20° C., 0° C., 20° C., 40° C., 60° C., 80° C., or 100° C., including ranges between any of the foregoing values, and may be held substantially constant or varied during the printing.

The printed polymer precursor composition may form a precursor coating on the substrate, which may be cured to cross-link and polymerize the curable material. A curing source such as a light source or a heat source, for example, may be used to process the mixture and may include an energized array of filaments that may generate energy to sufficiently heat the curable material. According to some embodiments, the precursor coating thickness may range from approximately 10 nm to approximately 10 micrometers, e.g., approximately 10 nm, approximately 20 nm, approximately 50 nm, approximately 100 nm, approximately 200 nm, approximately 500 nm, approximately 1000 nm, approximately 2000 nm, approximately 5000 nm, or approximately 10000 nm, including ranges between any of the foregoing values.

In some embodiments, polymerization may be achieved by exposing the precursor coating to heat or actinic radiation. In some examples, "actinic radiation" may refer to energy capable of breaking covalent bonds in a material. Examples may include electrons, electron beams, x-rays, gamma rays, ultraviolet and visible light, and ions at appropriately high energy levels. By way of example, a single UV lamp or a set of UV lamps may be used as a source for actinic radiation. When using a high lamp power, the curing time may be reduced. Another source for actinic radiation may include a laser (e.g., a UV, IR, or visible laser) or light emitting diode (LED).

Additionally or alternatively, a heat source may generate heat to initiate reaction between monomers, monomer initiators, and/or cross-linking agents. The monomers, monomer initiators, and/or cross-linking agents may react upon heating and/or actinic radiation exposure to form a polymer as described herein.

In some embodiments, polymerization may be free radical initiated. In such embodiments, free radical initiation may be performed by exposure to actinic radiation or heat. In addition to, or in lieu of, actinic radiation and heat-generated free radicals, polymerization of the nanovoided polymer may be atom transfer radical initiated, electrochemically initiated, plasma initiated, or ultrasonically initiated, as well as combinations of the foregoing. In certain embodiments, example additives to the polymer precursor composition that may be used to induce free radical initiation include azo compounds, peroxides, and halogens.

In some embodiments, a polymerization catalyst may be used. Example polymerization catalysts, which may be incorporated into the polymer precursor composition, include, hydrosilylation catalysts, polyamines, sulfur, styrenes, epoxies, isocyanates, and higher fatty acids or their esters, as well as combinations thereof.

According to some embodiments, curing of the precursor coating may be performed during the act of printing, or curing may be performed after printing one or more layers. For instance, heat generated by an inkjet print head may be used to at least partially cure the precursor coating in situ.

In some embodiments, the polymerization process may not be limited to a single curing step. Rather, it may be possible to carry out polymerization by two or more steps, whereby, as an example, the precursor coating may be exposed to two or more lamps of the same type or two or more different lamps in sequence. The curing temperature of different curing steps may be the same or different. The lamp power, wavelength, and dose from different lamps may also be the same or different. In one embodiment, the polymerization may be carried out in air; however, polymerizing in an inert gas atmosphere like nitrogen or argon is also contemplated.

In various aspects, the curing time may depend on the reactivity of the precursor coating, the thickness of the precursor coating, the type of polymerization initiator and the power of a UV lamp, for example. The UV curing time may be approximately 60 minutes or less, e.g., less than 5 minutes, less than 3 minutes, or less than 1 minute. In another embodiment, short curing times of less than 30 seconds may be used for mass production.

As will be appreciated, curing of the deposited layer may additionally induce phase separation between the nascent polymer layer and the solvent. In a further processing step, the solvent, which may be segregated into discrete regions, may be removed from the polymer matrix to form voids, i.e., in regions previously occupied by the solvent. In some embodiments, a change in temperature or pressure may be used to evaporate the solvent from the polymer matrix. In some embodiments, as will be appreciated by those skilled in the art, the solvent may be removed from the cross-linked polymer by supercritical fluid extraction. Example materials that may be used for supercritical fluid extraction include carbon dioxide, methanol, ethanol, acetone, and nitrous oxide, as well as combinations thereof. For instance, carbon dioxide may be combined with methanol and/or ethanol as co-solvents.

In certain embodiments, the solvent may form an emulsion with one or more components of the polymer precursor composition, e.g., during curing, and the emulsion may be removed from the cross-linked polymer to form nanovoids. In some embodiments, a change in temperature and/or pressure may be used to liberate the emulsified material from the polymer matrix.

Example methods for forming an emulsion include high pressure homogenization, ultrasonication, water dilution, an increase (decrease) in temperature to above (below) a phase inversion temperature of the polymer precursor composition, and/or a change in concentration of the polymer precursor composition to achieve an emulsion inversion point. An emulsion may be formed using low or high energy methods, i.e., by exposure to an energy source having an output power density of from approximately $10^3$ W/kg to approximately $10^{10}$ W/kg, e.g., $10^3$ W/kg, $10^4$ W/kg, $10^5$ W/kg, $10^6$ W/kg, $10^7$ W/kg, $10^8$ W/kg, $10^9$ W/kg, or $10^{10}$ W/kg, including ranges between any of the foregoing values.

In some embodiments, an emulsion may be formed before loading the polymer precursor composition into the reservoir of an inkjet printer cartridge or after loading the polymer precursor composition into the reservoir but before printing. In some embodiments, an emulsion may be formed by treating the precursor coating, i.e., after inkjet printing.

In some embodiments, a deterministic nanovoided structure may be created by nano-imprint lithography or microreplication. The deterministic nanovoided structure may or may not include undercut portions. An example of an undercut portion may include, for example, trapezoidal posts or ridges.

The nanovoided polymer layers disclosed herein may be incorporated into various electromechanical elements, i.e., structured actuators. According to certain embodiments, an electromechanical element may include a primary electrode, a secondary electrode overlapping at least a portion of the primary electrode, and a nanovoided polymer layer disposed between and abutting the primary electrode and the secondary electrode.

In some embodiments, a structured actuator may be coupled to an optical element such as a tunable lens and may include an electroded layer of a nanovoided polymer disposed over or proximate to a surface of the tunable lens. The tunable lens may be a liquid lens, for example, and may have a geometry selected from prismatic, freeform, plano, meniscus, bi-convex, plano-convex, bi-concave, or plano-concave. In certain embodiments, a further optical element may be disposed over a second surface of the tunable lens. The optical element may be incorporated into a head mounted display, e.g., within a transparent aperture thereof.

In the presence of an electrostatic field (E-field), an electroactive polymer may deform (e.g., compress, elongate, bend, etc.) according to the magnitude and direction of the applied field. Generation of such a field may be accomplished by placing the electroactive polymer between two electrodes, e.g., a primary electrode and a secondary electrode, each of which is at a different potential. As the potential difference (i.e., voltage difference) between the electrodes is increased or decreased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In accordance with various embodiments, liquid lenses can be used to enhance imaging system flexibility across a wide variety of applications that benefit from rapid focusing. According to certain embodiments, by integrating an actuatable liquid lens, an imaging system can rapidly change the plane of focus to provide a sharper image, independent of an object's distance from a camera. The use of liquid lenses may be particularly advantageous for applications that involve focusing at multiple distances, where objects under inspection may have different sizes or may be located at varying distances from the lens, such as package sorting, barcode reading, security, and rapid automation, in addition to virtual reality/augmented reality devices.

The electrodes (e.g., the primary electrode and the secondary electrode) may include one or more electrically conductive materials, such as a metal, a semiconductor (e.g., a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium gallium tin oxide, indium gallium zinc oxide, indium gallium zinc tin oxide, strontium vanadate, strontium niobate, strontium molybdate, calcium molybdate, and indium zinc tin oxide.

In some embodiments, the electrodes (e.g., the primary electrode and the secondary electrode) may have a thickness of approximately 1 nm to approximately 1000 nm, with an example thickness of approximately 10 nm to approximately 50 nm. Some of the electrodes may be designed to allow healing of electrical breakdown (e.g., associated with the electric breakdown of elastomeric polymer materials). A thickness of an electrode that includes a self-healing material (e.g., a graphene electrode) may be approximately 30 nm.

The electrodes in some embodiments may be configured to stretch elastically. In such embodiments, the electrodes may include TCO particles, graphene, carbon nanotubes, and the like. In other embodiments, relatively rigid electrodes (e.g. electrodes including a metal such as aluminum) may be used. The electrode, i.e., the electrode material, may be selected to achieve a desired deformability, transparency, and optical clarity for a given application. By way of example, the yield point of a deformable electrode may occur at an engineering strain of at least 0.5%.

The electrodes (e.g., the primary electrode and the secondary electrode) may be fabricated using any suitable process. For example, the electrodes may be fabricated using physical vapor deposition (PVD), chemical vapor deposition (CVD), evaporation, spray-coating, dip-coating, spin-coating, atomic layer deposition (ALD), and the like. In another aspect, the electrodes may be manufactured using a thermal evaporator, a sputtering system, a spray coater, a spin-coater, etc.

In some embodiments, one or more electrodes may be electrically interconnected, e.g., through a contact layer, to a common electrode. In some embodiments, an electroactive device may have a first common electrode connected to a first plurality of electrodes, and a second common electrode connected to a second plurality of electrodes. In some embodiments, electrodes (e.g., one of a first plurality of electrodes and one of a second plurality of electrodes) may be electrically isolated from each other using an insulator, such as a dielectric layer. In some embodiments, a contact layer or common electrode may be shaped to allow compression and expansion of an actuator during operation.

An insulator may include a material without appreciable electrical conductivity, and may include a dielectric material, such as, for example, an acrylate or silicone polymer. In some embodiments, an electrode (or other electrical connector) may include a metal. In some embodiments, an electrode (such as an electrical contact) or an electrical connector may include a similar material to other similar components.

The application of a voltage between the electrodes can cause compression of the intervening nanovoided polymer layer(s) in the direction of the applied electric field and an associated expansion or contraction of the polymer layer(s) in one or more transverse dimensions. In some embodiments, an applied voltage (e.g., to the primary electrode and/or the secondary electrode) may create at least approximately 0.1% strain (e.g., an amount of deformation in the direction of the applied force resulting from the applied voltage divided by the initial dimension of the material) in the electroactive polymer layer.

In some embodiments, a primary electrode may overlap (e.g., overlap in a parallel direction) at least a portion of a secondary electrode. The primary and secondary electrodes may be generally parallel and spaced apart. A tertiary electrode may overlap at least a portion of either the primary or secondary electrode. A structured actuator may include a first nanovoided polymer layer (e.g., an elastomer material), which may be disposed between a first pair of electrodes (e.g., the primary and the secondary electrode). The structured actuator may further include a second nanovoided polymer layer, which may be disposed between a second pair of electrodes (e.g., the primary and the tertiary electrode). In some embodiments, there may be an electrode that is common to both the first pair of electrodes and the second pair of electrodes.

In some embodiments, a common electrode may be electrically coupled (e.g., electrically contacted at an interface having a low contact resistance) to one or more other electrodes, e.g., a secondary and a tertiary electrode located on either side of a primary electrode. In some embodiments, an electroactive device may include additional electroactive elements interleaved between electrodes, for example in a stacked configuration. For example, electrodes may form an interdigitated stack, with alternate electrodes connected to a first common electrode through a first contact layer and the remaining alternate electrodes connected to a second common electrode through a second contact layer.

In some embodiments, a primary contact layer may be disposed over an end face of a primary electrode and a secondary contact layer may be disposed over an end face of a secondary electrode. Furthermore, the primary and secondary contact layers may be disposed over opposing end faces of an intervening electroactive layer, i.e., an electroactive polymer layer located between the primary electrode and the secondary electrode. In an example structured actuator, one or more dimensions of the primary contact layer may be different than corresponding dimensions of the secondary contact layer. In some embodiments, for example, a cross-sectional area of the primary contact layer may be different than a cross-sectional area of the secondary contact layer.

As used herein, a dimension (e.g., length, width, thickness, or area) of one element such as an electroactive layer, electrode, or contact layer that is "different" than a dimension of another element may, in certain examples, be at least approximately 2% different, e.g., approximately 2%, approximately 5%, approximately 10%, approximately 20%, approximately 50%, approximately 100%, approximately 150%, or approximately 200% or more different, including ranges between any of the foregoing values.

By way of example, an actuator stack may include a primary electrode, a secondary electrode overlapping at least a portion of the primary electrode, an electroactive layer disposed between and abutting the primary electrode and the secondary electrode, a primary contact layer disposed over an end face of the primary electrode, and a secondary contact layer disposed over an end face of the secondary electrode, wherein a cross-sectional area of the primary contact layer is different than a cross-sectional area of the secondary contact layer.

According to certain embodiments, an actuator assembly may include, from top to bottom, a first actuator stack, a bonding layer, and a second actuator stack. Each of the first actuator stack and the second actuator stack may include one or more electroactive layers disposed between paired electrodes (i.e., primary and secondary electrodes). During operation, the first actuator stack and the second actuator stack may be independently biased to provide a desired force and/or displacement output.

According to some embodiments, the dimensions (e.g., the areal dimensions) of the electrodes and/or the electroactive layers may vary throughout each actuator stack. For instance, the cross-sectional area of each successive electrode and each successive electroactive layer may continuously increase or decrease. By way of example, a cross-sectional area of a primary electrode may be different than a cross-sectional area of a secondary electrode.

The bonding layer may abut an electroactive layer in each of the first and second actuator stacks and may include an adhesive such as an epoxy or a pressure sensitive adhesive material. In certain embodiments, the bonding layer may include a matrix material (e.g., epoxy) and a thermally conductive material dispersed throughout the matrix material. The thermally conductive material may include particulate boron nitride or silicon carbide, for example, or a network of continuous or discontinuous fibers, such as carbon fibers, although particles or fibers of other metals or ceramics may be used. In some embodiments, the bonding layer may extend beyond the actuator assembly, for example, to facilitate mechanical connections to other systems.

In certain embodiments, a structured actuator may be integrated with an element having a negative stiffness, i.e., a negative spring. As will be explained in greater detail below, embodiments of the present disclosure relate also to structured actuators co-integrated with a negative stiffness spring that may be used to control an optical element. A negative stiffness spring may be configured to modify the load applied to the structured actuator, such that the spring is unloaded as the structured actuator bends.

Actuatable nanovoided polymer layers may be incorporated into a variety of passive and active optics. Example structures include tunable prisms and gratings as well as tunable form birefringent structures, which may include either a patterned nanovoided polymer layer having a uniform porosity or an un-patterned nanovoided polymer layer having spatially variable porosity. In some embodiments, the optical performance of a nanovoided polymer grating may be tuned through actuation of the grating, which may modify the pitch or height of the grating elements. In some embodiments, a nanovoided polymer layer having a tunable refractive index may be incorporated into an actively switchable optical waveguide. According to some embodiments, one or more optical properties of an optical element may be tuned through capacitive actuation, mechanical actuation, and/or acoustic actuation of a structured actuator.

While the nanovoided materials and the associated structured actuators of the present disclosure are described generally in connection with passive and active optics, the nanovoided materials may be used in other fields. For example, the structured actuators may be used, as part of, or in combination with optical retardation films, polarizers, compensators, beam splitters, reflective films, alignment layers, color filters, antistatic protection sheets, electromagnetic interference protection sheets, polarization-controlled lenses for autostereoscopic three-dimensional displays, and infrared reflection films, and the like.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-12, detailed descriptions of example structured actuators. The discussion associated with FIGS. 1-6 relates to various structured actuator configurations. The discussion associated with FIGS. 7-12 relates to exemplary virtual reality and augmented reality device architectures that may include a structured actuator as disclosed herein.

Referring to FIG. 1, shown is an example actuator assembly according to some embodiments. Actuator assembly 100 may include a first actuator stack 110 and a second actuator stack 120 overlying the first actuator stack 110. A bonding layer 130 may be disposed between the first actuator stack 110 and the second actuator stack 120.

Each actuator stack may include an architecture of interdigitated electrodes and intervening electroactive layers (e.g., nanovoided polymer layers). For instance, first actuator stack 110 may include a first primary electrode 112, a first secondary electrode 114 overlapping at least a portion of the first primary electrode 112, and a first electroactive layer 116 disposed between and abutting the first primary electrode 112 and the first secondary electrode 114, whereas second actuator stack 120 may include a second primary electrode 122, a second secondary electrode 124 overlapping at least a portion of the second primary electrode 122, and a second electroactive layer 126 disposed between and abutting the second primary electrode 122 and the second secondary electrode 124.

Referring still to FIG. 1, a first primary contact layer 142 may be disposed over a sidewall of the first actuator stack 110 in electrical contact with the first primary electrode 112, whereas a first secondary contact layer 144 may be disposed over a further sidewall of the first actuator stack 110 in electrical contact with the second primary electrode 114. Furthermore, a second primary contact layer 146 may be disposed over a sidewall of the second actuator stack 120 in electrical contact with the second primary electrode 122, while a second secondary contact layer 148 may be disposed over a further sidewall of the second actuator stack 120 in electrical contact with the second secondary electrode 124. The contact layers 142, 144, 146, 148 may be disposed also over sidewalls of respective electroactive layers. That is, first primary contact layer 142 and first secondary contact layer 144 may be disposed over sidewalls (e.g. opposing sidewalls) of first electroactive layer 116, and second primary contact layer 146 and second secondary contact layer 148 may be disposed over sidewalls (e.g., opposing sidewalls) of second electroactive layer 126.

A dielectric layer may be formed over remaining sidewalls of the actuator stacks (e.g., front and back sidewalls in FIG. 1). One or more dielectric layers may be adapted to inhibit electrical breakdown between electrodes, which can improve device reliability. In FIG. 1, dielectric layer 150 is shown covering the back sidewall of actuator assembly 100. So as to not obscure details of the first and second actuator stacks 110, 120, a dielectric layer has been omitted from the front sidewall of actuator assembly 100.

In some embodiments, lower surface 152 and upper surface 154 of actuator assembly 100 may each be attached to a fixed structure (not shown) such that bonding layer 130 may exert an output force and/or an output displacement through actuation of one or both of the first actuator stack 110 and the second actuator stack 120. In one example, a first voltage may be applied to the electrodes of the first actuator stack 110 while a second lesser voltage may be applied to the electrodes of the second actuator stack 120. The direction of the output force and/or displacement may then be reversed by decreasing the first voltage and increasing the second voltage, for example.

The structured actuators may, in certain embodiments, exhibit a variety of form factors, which may facilitate their integration into various system geometries. For instance, in some embodiments, a structured actuator may have a cross-sectional shape that is hexagonal, rectangular, trapezoidal, triangular, circular, oval, etc., including combinations thereof, although other shapes and combinations are contemplated.

Figure 2:
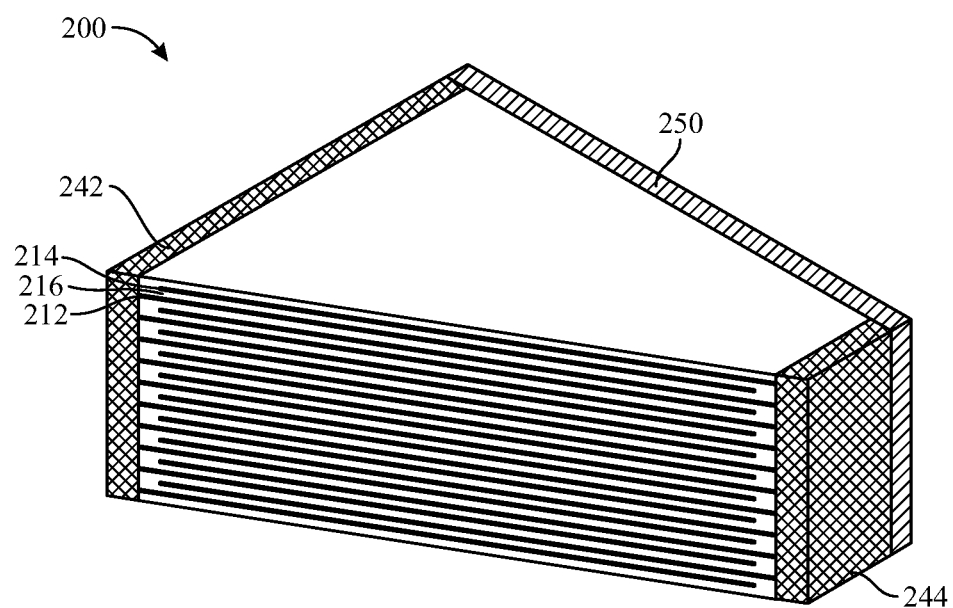
FIG. 2 is a perspective view of a structured actuator having opposing contact layers with different cross-sectional areas according to some embodiments.

An actuator stack having a trapezoidal cross-sectional shape is shown in FIG. 2. Actuator stack 200 includes a plurality of interdigitated electrodes, including primary electrode 212, secondary electrode 214 overlying the primary electrode 212, and an electroactive layer 216 disposed between the primary electrode 212 and the secondary electrode 214. In the illustrated embodiment, the electrodes (including the primary electrode 212 and the secondary electrode 214) and the electroactive layers (including first electroactive layer 216) have a tapered shape within the plane of each respective electrode and electroactive layer. The actuator stack 200 additionally includes a primary contact layer 242 overlying and in electrical contact with a sidewall of the primary electrode 212, and a secondary contact layer 244 overlying and in electrical contact with a sidewall of the secondary electrode 214. As illustrated, the cross-sectional area of the primary contact layer 242 may be greater than the cross-sectional area of the secondary contact layer 244. A dielectric layer 250 may cover the front face (not shown) as well as the back face of the actuator stack 200, i.e., overlying sidewalls of the plurality of electrodes.

Figure 3:
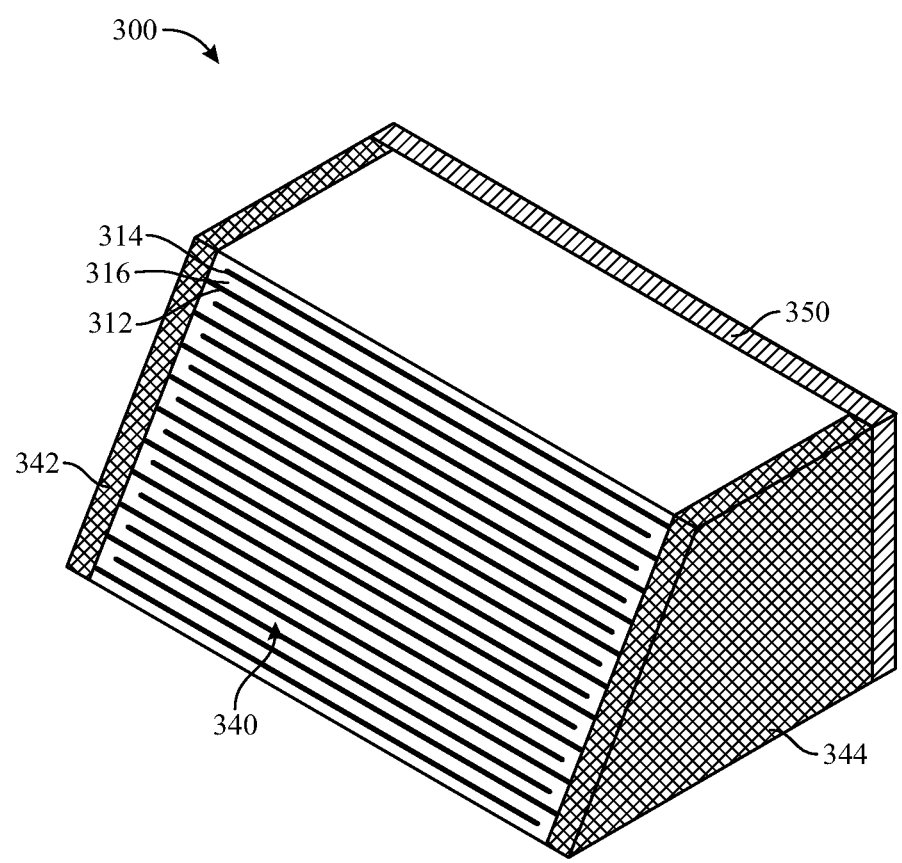
FIG. 3 is a perspective view of a structured actuator having a sloped sidewall according to some embodiments.

Referring to FIG. 3, shown is a schematic view of an actuator stack having a sloped sidewall. Actuator stack 300 may include a plurality of interdigitated electrodes, including primary electrode 312, secondary electrode 314 overlying the primary electrode 312, and an electroactive layer 316 disposed between the primary electrode 312 and the secondary electrode 314. In the illustrated embodiment, a primary contact layer 342 overlies and is in electrical contact with a sidewall of the primary electrode 312, while a secondary contact layer 344 overlies and is in electrical contact with a sidewall of the secondary electrode 314. The plurality of stacked electrodes and intervening electroactive layers may be arranged such that each successive layer in the stack may have at least one dimension (e.g., length and/or width) that is different than an adjacent layer defining sloped sidewall 340. A dielectric layer 350 may be disposed over the front face (not shown) as well as the back face of the actuator stack 300.

Figure 4:
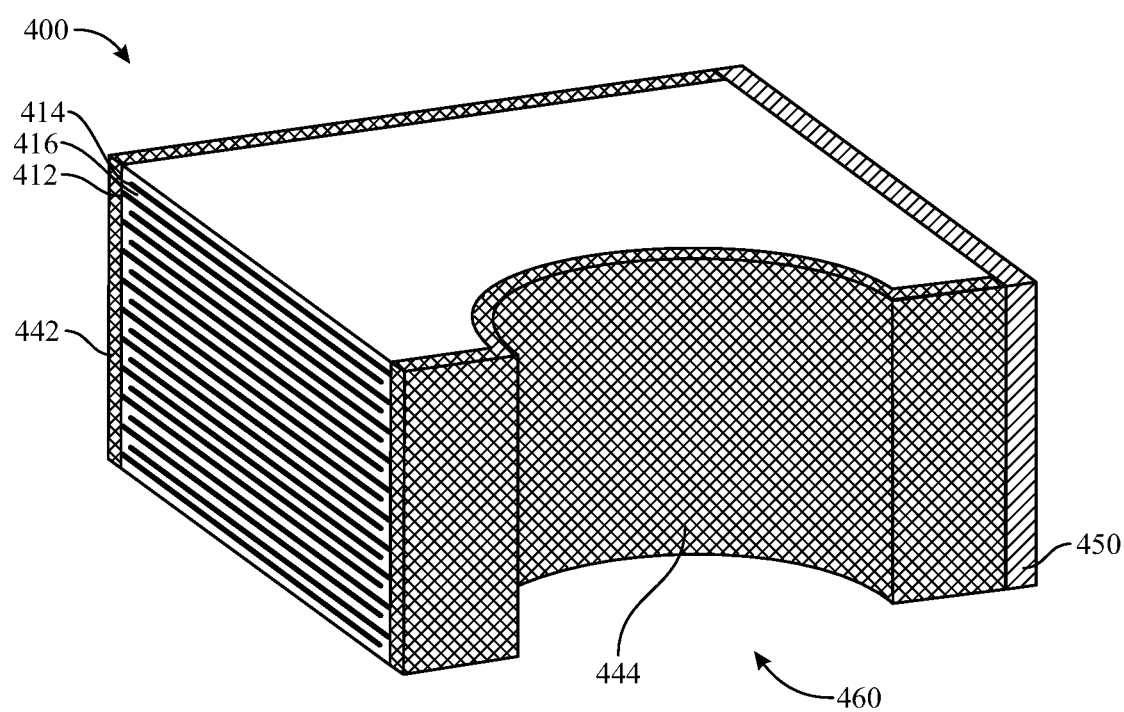
FIG. 4 is a perspective view of a structured actuator having a non-rectilinear shape and further including contact layers with different cross-sectional areas according to further embodiments.

An actuator stack having an arcuate cross-sectional shape is shown in FIG. 4. Actuator stack 400 may include a plurality of electrodes, including primary electrode 412, secondary electrode 414 overlying the primary electrode 412, and an electroactive layer 416 disposed between the primary electrode 412 and the secondary electrode 414. A primary contact layer 442 overlies and is in electrical contact with respective sidewalls of a first plurality of electrodes, including the primary electrode 312, while a secondary contact layer 444 overlies and is in electrical contact with respective sidewalls of a second plurality of electrodes, including the secondary electrode 414.

The plurality of electrodes and electroactive layers may be sized and dimensioned to form a notched or arcuate face 460. Such a non-planar face may be convex or, as shown in the embodiment of FIG. 4, concave. As will be appreciated, the cross-sectional area of primary contact layer 442 may be less that the cross-sectional area of secondary contact layer 444.

Figure 5:
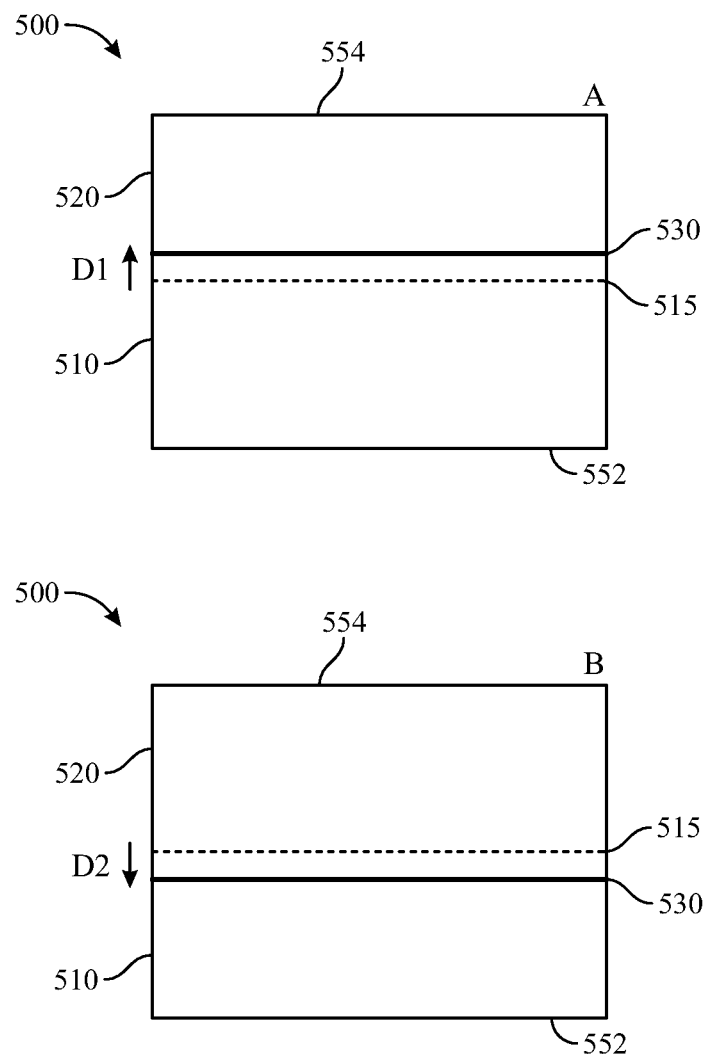
FIG. 5 illustrates an example method of operating an actuator assembly according to various embodiments.

Referring to FIG. 5, illustrated is an example method of operating an actuator assembly. As illustrated in FIG. 5A, actuator assembly 500 includes a first actuator stack 510, a second actuator stack 520 overlapping at least a portion of the first actuator stack 510, and a bonding layer 530 between the first actuator stack 510 and the second actuator stack 520. The first actuator stack 510 may include an anchored outer first force surface 552 and the second actuator stack 520 may include an anchored outer second force surface 554.

By applying a first voltage (V1) to the first actuator stack 510 and a second voltage (V2) to the second actuator stack 520 (where V1<V2), the bonding layer 530 may be displaced in a first direction (D1) relative to an unactuated displacement 515. Referring to FIG. 5B, by applying a third voltage (V3) to the first actuator stack 510 and a fourth voltage (V4) to the second actuator stack 520 (where V3>V4), the bonding layer 530 may be displaced in a second direction (D2). For a symmetric displacement, i.e., D1 approximately equal to D2, the first voltage (V1) may be is approximately equal to the fourth voltage (V4) and the second voltage (V2) may be approximately equal to the third voltage (V3).

As will be appreciated, various embodiments relate to the coupling of a negative stiffness spring with a structured actuator. In certain aspects, a negative stiffness spring may be used to decrease or otherwise modify the force needed to operate an actuator through at least a portion of its dynamic range. For instance, a negative stiffness spring may be configured to offset the force exerted by the actuator such that the resulting combined force is approximately zero for all displacements. Thus, during operation, the negative stiffness spring may exert a force (e.g., a constant force or a variable force) on the actuator that acts in a direction away from a zero-force position, i.e., as if being repelled. In some embodiments, friction may contribute to the negative stiffness spring force profile. The negative stiffness spring may have a constant or variable stiffness.

In some embodiments, the negative stiffness spring force may be numerically equal to and opposite in sense to the actuator force, thereby canceling the actuator force and rendering the overall change of force negligible over a certain range of deflection. In certain embodiments, a negative stiffness spring may be tuned to decrease the stresses associated with a given actuator force or displacement relative to the absence of a negative stiffness spring. In some embodiments, a negative stiffness spring may improve the energy efficiency of a structured actuator.

In some embodiments, the negative spring effect may be generated by releasing energy from a pre-loaded component, such as pre-compressed spring, a pre-tensioned membrane, or a pre-bent beam. The negative spring effect may be generated from buckling or snap-through behavior of a component. In some embodiments, the negative spring effect may be generated by an arrangement of permanent magnets applying a force on a ferromagnetic material attached to the actuator.

In some embodiments, the negative stiffness spring force may be larger and opposite in sense to the actuator force, e.g., for at least part of the actuator range of motion. This may create an actuator that has a finite range of stable positions, such as a bi-stable or tri-stable switch.

Figure 6:
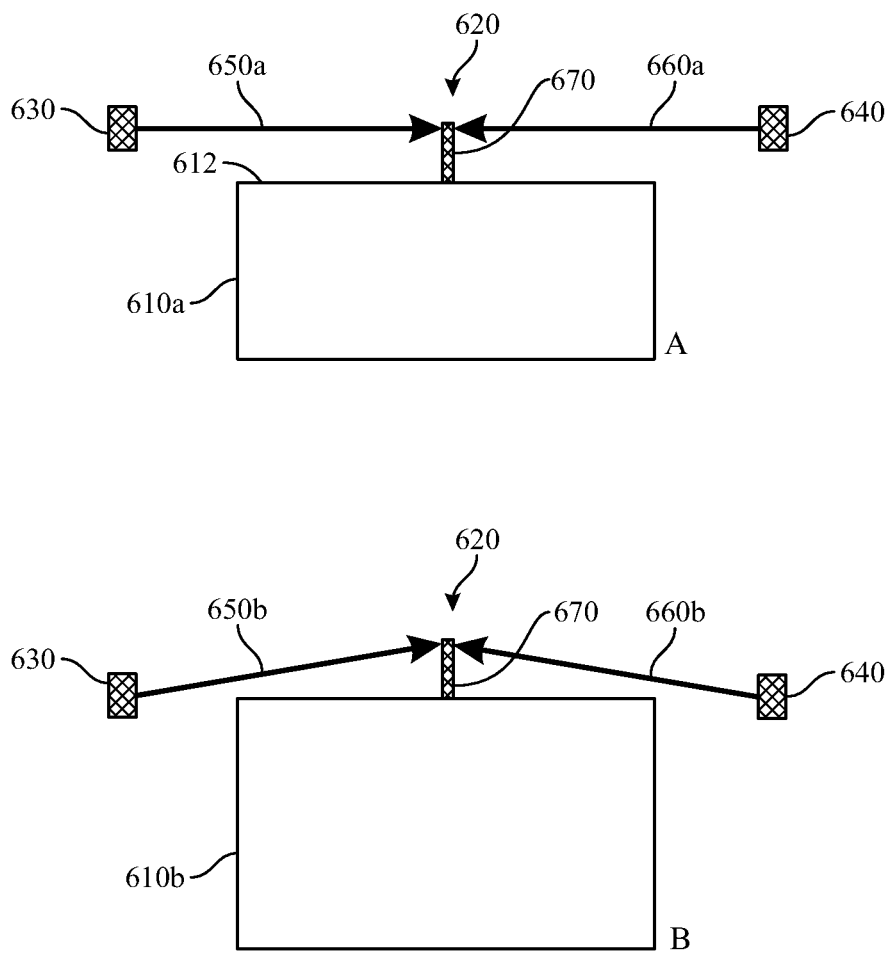
FIG. 6 is a cross-sectional view of a structured actuator coupled to a negative stiffness spring according to some embodiments.

The co-integration of a negative stiffness spring with a structured actuator is shown schematically in FIG. 6. With reference to FIG. 6A, actuator assembly 600 includes a structured actuator 610a and a negative stiffness spring assembly 620 coupled to the structured actuator 610a. During use, the negative stiffness spring assembly 620 may provide a force that assists the motion of the actuator, e.g., in compression or, as illustrated, in expansion.

That is, FIG. 6 illustrates an example method of creating a restorative (e.g., expansive) force on structured actuator 610a, where a displaceable surface 612 of the structured actuator 610a may be connected by linkage 670 to negative spring assembly 620. The negative spring assembly 620 may include a pair of fixed pivots 630, 640 and respective springs 650a, 660a, where in FIG. 6A the structured actuator 610a and the springs 650a, 660a are in a state of compression.

When a voltage between the electrodes (not shown) of structured actuator 610a is changed (e.g., decreased), internal restoring forces within the structured actuator 610a may induce a partial expansion, as shown in FIG. 6B. As will be appreciated, as the actuator 610a expands, the internal restoring forces may decrease, which may result in incomplete restoration. As shown in FIG. 6B, the internal restoring forces may be augmented by springs 650b, 660b, which are in a state of tension, to form expanded actuator 610b.

As used herein, a "negative stiffness spring" or "negative spring" may, in some examples, refer to a spring that exhibits global or local negative stiffness, i.e., having a negative stiffness spring constant (k<0). Thus, in certain embodiments, over some range of actuator stroke, the change in force and the change in displacement (as seen by the actuator) may be of opposite sign. This may be achieved by through coupling with a load offset, for example, using a pre-compressed spring, pre-bent beam, or an engineered guide path contour, or by using a non-linear spring. According to further examples, a negative stiffness spring may include a pre-tensioned membrane attached to the actuator and configured to move along a trajectory such that the tension in the membrane is reduced. The trajectory may be controlled by a mechanical flexure, for example, or by a mechanism, such as a guided bearing, that moves the membrane edge along a specific path. In each case, the negative stiffness spring may induce a local effect that is exhibited over a particular range of a force-displacement curve.

According to various embodiments, a structured actuator includes paired devices arranged in series and configured to exert complimentary forces that may beneficially impact the structured actuator's total exertable force in various modes of operation. In comparative, unpaired actuators, for instance, the force exerted in expansion is typically less than the force exerted in contraction, which may limit the efficiency of the actuator during bidirectional displacement. On the other hand, as disclosed herein, a structured actuator may include one device operable in expansion and a paired device operable in contraction for a given actuation intent. Thus, in some embodiments, bidirectional displacement may include the actuation of one of a pair of devices in contraction. The paired devices may include first and second nanovoided polymer actuators. The nanovoided polymer layers may be formed by inkjet printing, for example, which may enable the construction of actuators having a complex form factor and their co-integration with various optical and mechanical systems. In further embodiments, the paired devices may include a first nanovoided polymer actuator coupled to a negative spring.

EXAMPLE EMBODIMENTS

Example 1: An actuator assembly includes: (a) a first actuator stack having a first primary electrode, a first secondary electrode overlapping at least a portion of the first primary electrode, and a first electroactive layer disposed between and abutting the first primary electrode and the first secondary electrode, (b) a second actuator stack having a second primary electrode, a second secondary electrode overlapping at least a portion of the second primary electrode, and a second electroactive layer disposed between and abutting the second primary electrode and the second secondary electrode; and (c) a bonding layer disposed between the first actuator stack and the second actuator stack.

Example 2: The actuator assembly of Example 1, where the first electroactive layer and the second electroactive layer each include a nanovoided polymer.

Example 3: The actuator assembly of any of Examples 1 and 2, where a cross-sectional area of the first primary electrode is different than a cross-sectional area of the first secondary electrode.

Example 4: The actuator assembly of any of Examples 1-3, where the bonding layer includes a layer of adhesive material.

Example 5: The actuator assembly of any of Examples 1-4, where the bonding layer includes a matrix material and a thermally conductive material dispersed throughout the matrix material.

Example 6: The actuator assembly of any of Examples 1-5, where the bonding layer includes particles or fibers of a metal or a ceramic.

Example 7: The actuator assembly of any of Examples 1-6, where the bonding layer abuts both an electroactive layer of the first actuator stack and an electroactive layer of the second actuator stack.

Example 8: The actuator assembly of any of Examples 1-7, further including a first primary contact layer disposed over an end face of the first primary electrode and a first secondary contact layer disposed over an end face of the first secondary electrode.

Example 9: The actuator assembly of Example 8, where the first primary contact layer is disposed over an end face of the first electroactive layer and the first secondary contact layer disposed over an end face of the second electroactive layer.

Example 10: The actuator assembly of Example 8, where a cross-sectional area of the first primary contact layer is different than a cross-sectional area of the first secondary contact layer.

Example 11: The actuator assembly of any of Examples 1-10, where the first actuator stack includes an anchored outer first force surface and the second actuator stack includes an anchored outer second force surface.

Example 12: The actuator assembly of any of Examples 1-11, where the first actuator stack and the second actuator stack each have a non-rectangular cross-sectional shape.

Example 13: The actuator assembly of any of Examples 1-12, further including a negative stiffness spring coupled to an outer first force surface of the first actuator stack.

Example 14: An actuator stack includes a primary electrode, a secondary electrode overlapping at least a portion of the primary electrode, an electroactive layer disposed between and abutting the primary electrode and the secondary electrode, a primary contact layer disposed over an end face of the primary electrode, and a secondary contact layer disposed over an end face of the secondary electrode, where a cross-sectional area of the primary contact layer is different than a cross-sectional area of the secondary contact layer.

Example 15: The actuator stack of Example 14, further including a dielectric layer disposed over sidewalls of the primary electrode and the secondary electrode.

Example 16: The actuator stack of any of Examples 14 and 15, where a cross-sectional area of the primary electrode is different than a cross-sectional area of the secondary electrode.

Example 17: The actuator stack of any of Examples 14-16, further including an outer electroactive layer disposed over the secondary electrode opposite to the primary electrode, and a negative stiffness spring coupled to the outer electroactive layer.

Example 18: A method includes (a) forming an actuator assembly including a first actuator stack, a second actuator stack overlapping at least a portion of the first actuator stack, and a bonding layer between the first actuator stack and the second actuator stack, (b) applying at least one of a force or a displacement to the bonding layer in a first direction by applying a first voltage to the first actuator stack and a second voltage to the second actuator stack, wherein the first voltage is less than the second voltage; and (c) applying at least one of a force or a displacement to the bonding layer in a second direction opposite the first direction by applying a third voltage to the first actuator stack and a fourth voltage to the second actuator stack, wherein the third voltage is greater than the fourth voltage.

Example 19: The method of Example 18, where the first actuator stack includes an anchored outer first force surface and the second actuator stack includes an anchored outer second force surface.

Example 20: The method of any of Examples 18 and 19, where the first voltage is approximately equal to the fourth voltage and the second voltage is approximately equal to the third voltage.

Embodiments of the present disclosure may include or be implemented in conjunction with various types of artificial-reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs), an example of which is augmented-reality system 700 in FIG. 7. Other artificial-reality systems may include an NED that also provides visibility into the real world (e.g., augmented-reality system 800 in FIG. 8) or that visually immerses a user in an artificial reality (e.g., virtual-reality system 900 in FIG. 9). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 7:
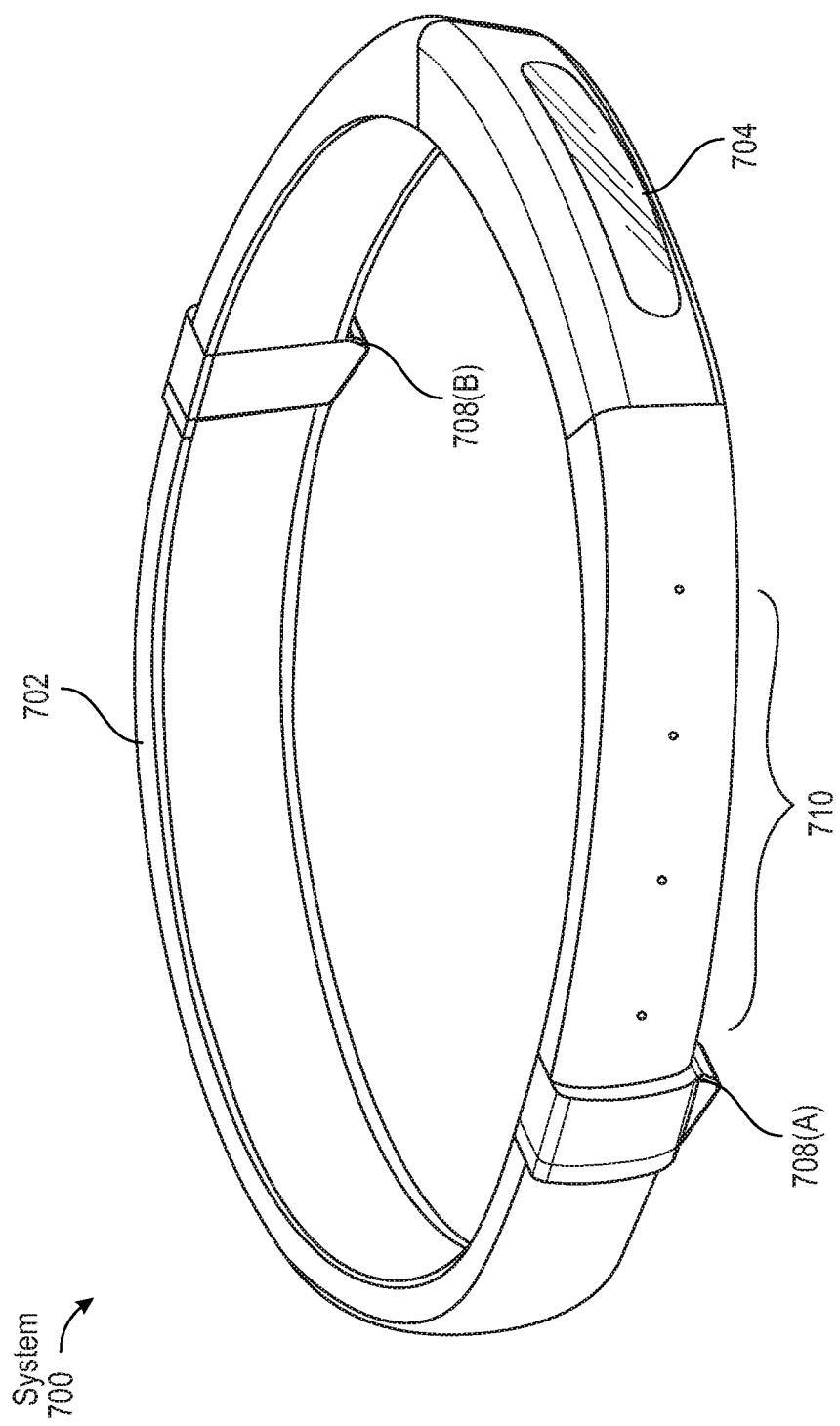
FIG. 7 is an illustration of an exemplary artificial-reality headband that may be used in connection with embodiments of this disclosure.

Turning to FIG. 7, augmented-reality system 700 generally represents a wearable device dimensioned to fit about a body part (e.g., a head) of a user. As shown in FIG. 7, system 700 may include a frame 702 and a camera assembly 704 that is coupled to frame 702 and configured to gather information about a local environment by observing the local environment. Augmented-reality system 700 may also include one or more audio devices, such as output audio transducers 708(A) and 708(B) and input audio transducers 710. Output audio transducers 708(A) and 708(B) may provide audio feedback and/or content to a user, and input audio transducers 710 may capture audio in a user's environment.

As shown, augmented-reality system 700 may not necessarily include an NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 700 may not include an NED, augmented-reality system 700 may include other types of screens or visual feedback devices (e.g., a display screen integrated into a side of frame 702).

Figure 8:
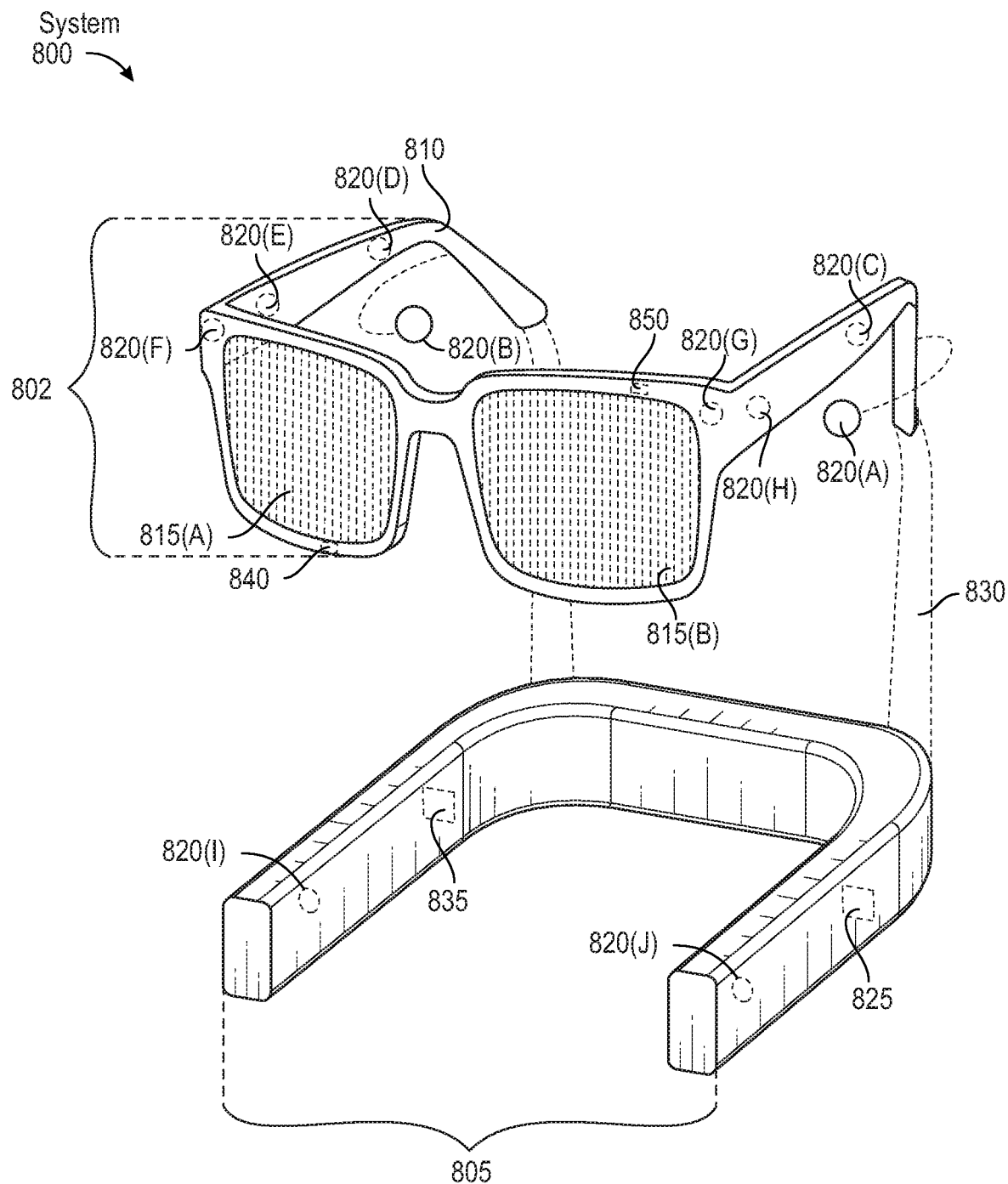
FIG. 8 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 8, augmented-reality system 800 may include an eyewear device 802 with a frame 810 configured to hold a left display device 815(A) and a right display device 815(B) in front of a user's eyes. Display devices 815(A) and 815(B) may act together or independently to present an image or series of images to a user. While augmented-reality system 800 includes two displays, embodiments of this disclosure may be implemented in augmented-reality systems with a single NED or more than two NEDs.

In some embodiments, augmented-reality system 800 may include one or more sensors, such as sensor 840. Sensor 840 may generate measurement signals in response to motion of augmented-reality system 800 and may be located on substantially any portion of frame 810. Sensor 840 may represent a position sensor, an inertial measurement unit (IMU), a depth camera assembly, or any combination thereof. In some embodiments, augmented-reality system 800 may or may not include sensor 840 or may include more than one sensor. In embodiments in which sensor 840 includes an IMU, the IMU may generate calibration data based on measurement signals from sensor 840. Examples of sensor 840 may include, without limitation, accelerometers, gyroscopes, magnetometers, other suitable types of sensors that detect motion, sensors used for error correction of the IMU, or some combination thereof. Augmented-reality system 800 may also include a microphone array with a plurality of acoustic transducers 820(A)-820(J), referred to collectively as acoustic transducers 820. Acoustic transducers 820 may be transducers that detect air pressure variations induced by sound waves. Each acoustic transducer 820 may be configured to detect sound and convert the detected sound into an electronic format (e.g., an analog or digital format). The microphone array in FIG. 2 may include, for example, ten acoustic transducers: 820(A) and 820(B), which may be designed to be placed inside a corresponding ear of the user, acoustic transducers 820(C), 820(D), 820(E), 820(F), 820 (G), and 820(H), which may be positioned at various locations on frame 810, and/or acoustic transducers 820(I) and 820(J), which may be positioned on a corresponding neckband 805.

In some embodiments, one or more of acoustic transducers 820(A)-(F) may be used as output transducers (e.g., speakers). For example, acoustic transducers 820(A) and/or 820(B) may be earbuds or any other suitable type of headphone or speaker.

The configuration of acoustic transducers 820 of the microphone array may vary. While augmented-reality system 800 is shown in FIG. 8 as having ten acoustic transducers 820, the number of acoustic transducers 820 may be greater or less than ten. In some embodiments, using higher numbers of acoustic transducers 820 may increase the amount of audio information collected and/or the sensitivity and accuracy of the audio information. In contrast, using a lower number of acoustic transducers 820 may decrease the computing power required by an associated controller 850 to process the collected audio information. In addition, the position of each acoustic transducer 820 of the microphone array may vary. For example, the position of an acoustic transducer 820 may include a defined position on the user, a defined coordinate on frame 810, an orientation associated with each acoustic transducer 820, or some combination thereof.

Acoustic transducers 820(A) and 820(B) may be positioned on different parts of the user's ear, such as behind the pinna or within the auricle or fossa. Or, there may be additional acoustic transducers 820 on or surrounding the ear in addition to acoustic transducers 820 inside the ear canal. Having an acoustic transducer 820 positioned next to an ear canal of a user may enable the microphone array to collect information on how sounds arrive at the ear canal. By positioning at least two of acoustic transducers 820 on either side of a user's head (e.g., as binaural microphones), augmented-reality device 800 may simulate binaural hearing and capture a 3D stereo sound field around about a user's head. In some embodiments, acoustic transducers 820(A) and 820(B) may be connected to augmented-reality system 800 via a wired connection 830, and in other embodiments, acoustic transducers 820(A) and 820(B) may be connected to augmented-reality system 800 via a wireless connection (e.g., a Bluetooth connection). In still other embodiments, acoustic transducers 820(A) and 820(B) may not be used at all in conjunction with augmented-reality system 800.

Acoustic transducers 820 on frame 810 may be positioned along the length of the temples, across the bridge, above or below display devices 815(A) and 815(B), or some combination thereof. Acoustic transducers 820 may be oriented such that the microphone array is able to detect sounds in a wide range of directions surrounding the user wearing the augmented-reality system 800. In some embodiments, an optimization process may be performed during manufacturing of augmented-reality system 800 to determine relative positioning of each acoustic transducer 820 in the microphone array.

In some examples, augmented-reality system 800 may include or be connected to an external device (e.g., a paired device), such as neckband 805. Neckband 805 generally represents any type or form of paired device. Thus, the following discussion of neckband 805 may also apply to various other paired devices, such as charging cases, smart watches, smart phones, wrist bands, other wearable devices, hand-held controllers, tablet computers, laptop computers and other external compute devices, etc.

As shown, neckband 805 may be coupled to eyewear device 802 via one or more connectors. The connectors may be wired or wireless and may include electrical and/or non-electrical (e.g., structural) components. In some cases, eyewear device 802 and neckband 805 may operate independently without any wired or wireless connection between them. While FIG. 8 illustrates the components of eyewear device 802 and neckband 805 in example locations on eyewear device 802 and neckband 805, the components may be located elsewhere and/or distributed differently on eyewear device 802 and/or neckband 805. In some embodiments, the components of eyewear device 802 and neckband 805 may be located on one or more additional peripheral devices paired with eyewear device 802, neckband 805, or some combination thereof.

Pairing external devices, such as neckband 805, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 800 may be provided by a paired device or shared between a paired device and an eyewear device, thus reducing the weight, heat profile, and form factor of the eyewear device overall while still retaining desired functionality. For example, neckband 805 may allow components that would otherwise be included on an eyewear device to be included in neckband 805 since users may tolerate a heavier weight load on their shoulders than they would tolerate on their heads. Neckband 805 may also have a larger surface area over which to diffuse and disperse heat to the ambient environment. Thus, neckband 805 may allow for greater battery and computation capacity than might otherwise have been possible on a stand-alone eyewear device. Since weight carried in neckband 805 may be less invasive to a user than weight carried in eyewear device 802, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 805 may be communicatively coupled with eyewear device 802 and/or to other devices. These other devices may provide certain functions (e.g., tracking, localizing, depth mapping, processing, storage, etc.) to augmented-reality system 800. In the embodiment of FIG. 8, neckband 805 may include two acoustic transducers (e.g., 820(I) and 820(J)) that are part of the microphone array (or potentially form their own microphone subarray). Neckband 805 may also include a controller 825 and a power source 835.

Acoustic transducers 820(I) and 820(J) of neckband 805 may be configured to detect sound and convert the detected sound into an electronic format (analog or digital). In the embodiment of FIG. 8, acoustic transducers 820(I) and 820(J) may be positioned on neckband 805, thereby increasing the distance between the neckband acoustic transducers 820(I) and 820(J) and other acoustic transducers 820 positioned on eyewear device 802. In some cases, increasing the distance between acoustic transducers 820 of the microphone array may improve the accuracy of beamforming performed via the microphone array. For example, if a sound is detected by acoustic transducers 820(C) and 820(D) and the distance between acoustic transducers 820(C) and 820 (D) is greater than, e.g., the distance between acoustic transducers 820(D) and 820(E), the determined source location of the detected sound may be more accurate than if the sound had been detected by acoustic transducers 820(D) and 820(E).

Controller 825 of neckband 805 may process information generated by the sensors on neckband 805 and/or augmented-reality system 800. For example, controller 825 may process information from the microphone array that describes sounds detected by the microphone array. For each detected sound, controller 825 may perform a direction-of-arrival (DOA) estimation to estimate a direction from which the detected sound arrived at the microphone array. As the microphone array detects sounds, controller 825 may populate an audio data set with the information. In embodiments in which augmented-reality system 800 includes an inertial measurement unit, controller 825 may compute all inertial and spatial calculations from the IMU located on eyewear device 802. A connector may convey information between augmented-reality system 800 and neckband 805 and between augmented-reality system 800 and controller 825. The information may be in the form of optical data, electrical data, wireless data, or any other transmittable data form. Moving the processing of information generated by augmented-reality system 800 to neckband 805 may reduce weight and heat in eyewear device 802, making it more comfortable to the user.

Power source 835 in neckband 805 may provide power to eyewear device 802 and/or to neckband 805. Power source 835 may include, without limitation, lithium ion batteries, lithium-polymer batteries, primary lithium batteries, alkaline batteries, or any other form of power storage. In some cases, power source 835 may be a wired power source. Including power source 835 on neckband 805 instead of on eyewear device 802 may help better distribute the weight and heat generated by power source 835.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 900 in FIG. 9, that mostly or completely covers a user's field of view. Virtual-reality system 900 may include a front rigid body 902 and a band 904 shaped to fit around a user's head. Virtual-reality system 900 may also include output audio transducers 906(A) and 906(B). Furthermore, while not shown in FIG. 9, front rigid body 902 may include one or more electronic elements, including one or more electronic displays, one or more inertial measurement units (IMUs), one or more tracking emitters or detectors, and/or any other suitable device or system for creating an artificial reality experience.

Artificial-reality systems may include a variety of types of visual feedback mechanisms. For example, display devices in augmented-reality system 800 and/or virtual-reality system 900 may include one or more liquid crystal displays (LCDs), light emitting diode (LED) displays, organic LED (OLED) displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial-reality systems may include one or more projection systems. For example, display devices in augmented-reality system 800 and/or virtual-reality system 900 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. Artificial-reality systems may also be configured with any other suitable type or form of image projection system.

Artificial-reality systems may also include various types of computer vision components and subsystems. For example, augmented-reality system 700, augmented-reality system 800, and/or virtual-reality system 900 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIGS. 7 and 9, output audio transducers 708(A), 708(B), 906(A), and 906(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 710 may include condenser microphones, dynamic microphones, ribbon microphones, and/or any other type or form of input transducer. In some embodiments, a single transducer may be used for both audio input and audio output.

Figure 9:
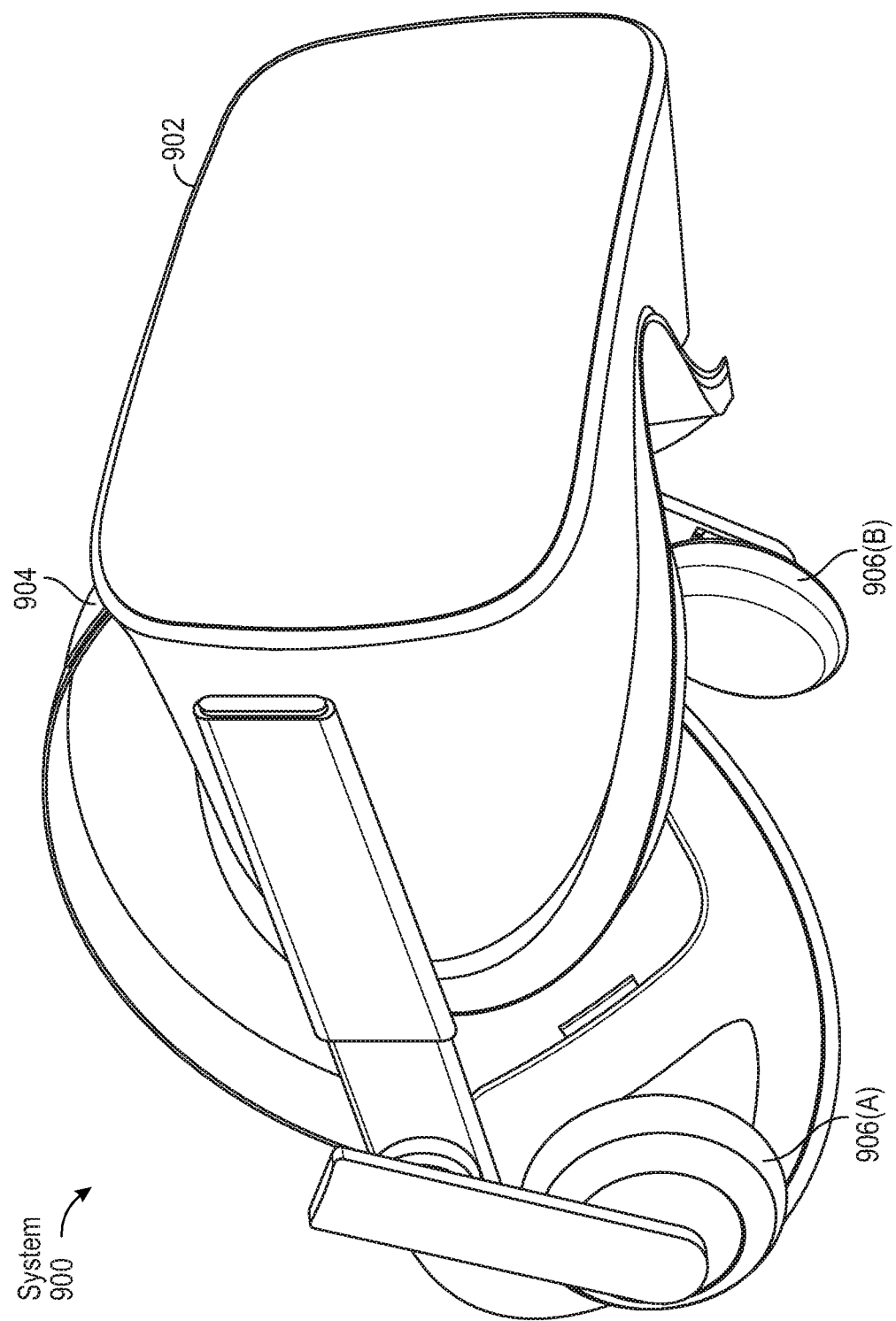
FIG. 9 is an illustration of an exemplary virtual-reality headset that may be used in connection with embodiments of this disclosure.

While not shown in FIGS. 7-9, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial-reality experience in one or more of these contexts and environments and/or in other contexts and environments.

As noted, artificial-reality systems 700, 800, and 900 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 10:
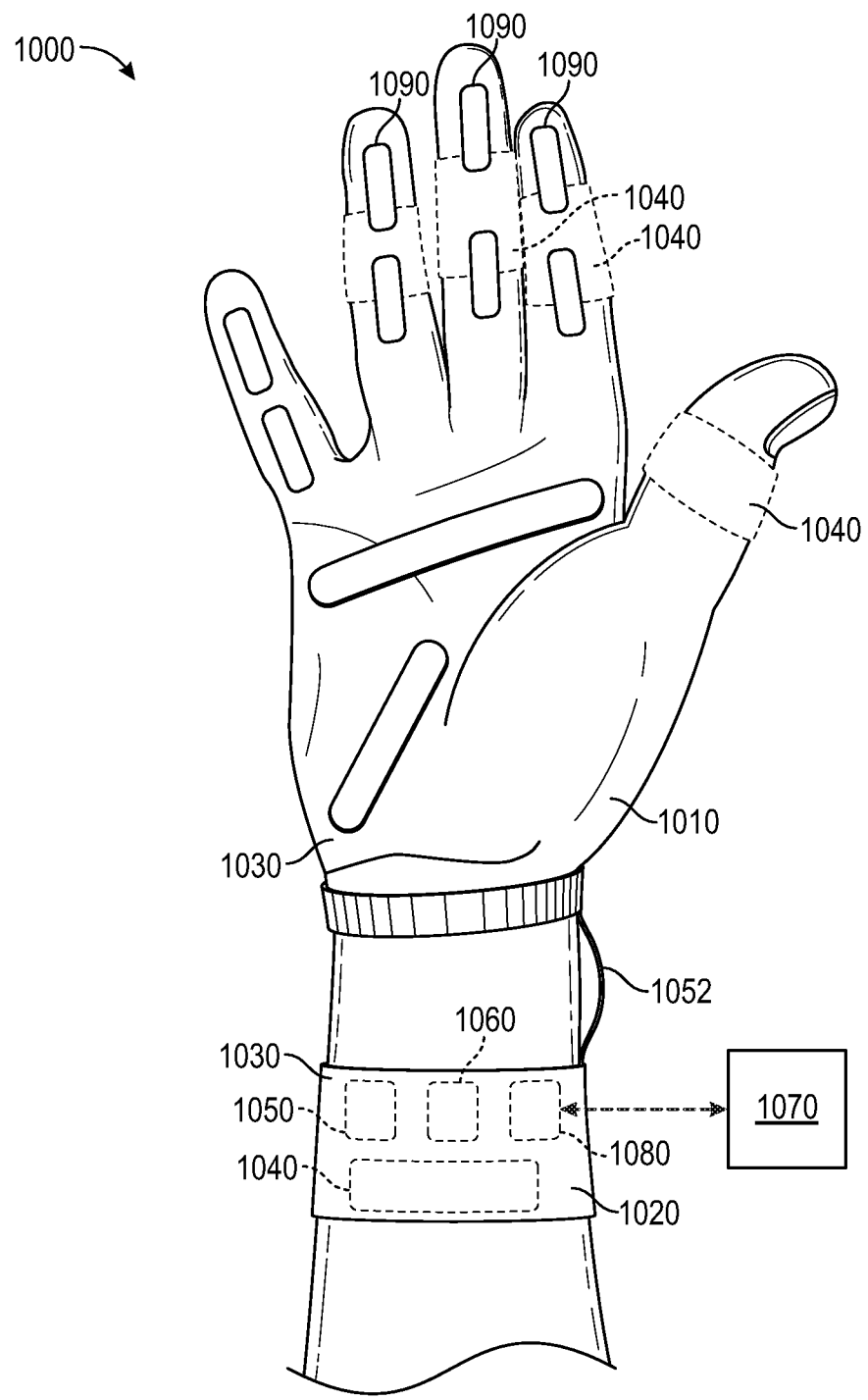
FIG. 10 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 10 illustrates a vibrotactile system 1000 in the form of a wearable glove (haptic device 1010) and wristband (haptic device 1020). Haptic device 1010 and haptic device 1020 are shown as examples of wearable devices that include a flexible, wearable textile material 1030 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1040 may be positioned at least partially within one or more corresponding pockets formed in textile material 1030 of vibrotactile system 1000. Vibrotactile devices 1040 may be positioned in locations to provide a vibrating sensation (e.g., haptic feedback) to a user of vibrotactile system 1000. For example, vibrotactile devices 1040 may be positioned to be against the user's finger(s), thumb, or wrist, as shown in FIG. 10. Vibrotactile devices 1040 may, in some examples, be sufficiently flexible to conform to or bend with the user's corresponding body part(s).

A power source 1050 (e.g., a battery) for applying a voltage to the vibrotactile devices 1040 for activation thereof may be electrically coupled to vibrotactile devices 1040, such as via conductive wiring 1052. In some examples, each of vibrotactile devices 1040 may be independently electrically coupled to power source 1050 for individual activation. In some embodiments, a processor 1060 may be operatively coupled to power source 1050 and configured (e.g., programmed) to control activation of vibrotactile devices 1040.

Vibrotactile system 1000 may be implemented in a variety of ways. In some examples, vibrotactile system 1000 may be a standalone system with integral subsystems and components for operation independent of other devices and systems. As another example, vibrotactile system 1000 may be configured for interaction with another device or system 1070. For example, vibrotactile system 1000 may, in some examples, include a communications interface 1080 for receiving and/or sending signals to the other device or system 1070. The other device or system 1070 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1080 may enable communications between vibrotactile system 1000 and the other device or system 1070 via a wireless (e.g., Wi-Fi, Bluetooth, cellular, radio, etc.) link or a wired link. If present, communications interface 1080 may be in communication with processor 1060, such as to provide a signal to processor 1060 to activate or deactivate one or more of the vibrotactile devices 1040.

Vibrotactile system 1000 may optionally include other subsystems and components, such as touch-sensitive pads 1090, pressure sensors, motion sensors, position sensors, lighting elements, and/or user interface elements (e.g., an on/off button, a vibration control element, etc.). During use, vibrotactile devices 1040 may be configured to be activated for a variety of different reasons, such as in response to the user's interaction with user interface elements, a signal from the motion or position sensors, a signal from the touch-sensitive pads 1090, a signal from the pressure sensors, a signal from the other device or system 1070, etc.

Although power source 1050, processor 1060, and communications interface 1080 are illustrated in FIG. 10 as being positioned in haptic device 1020, the present disclosure is not so limited. For example, one or more of power source 1050, processor 1060, or communications interface 1080 may be positioned within haptic device 1010 or within another wearable textile.

Figure 11:
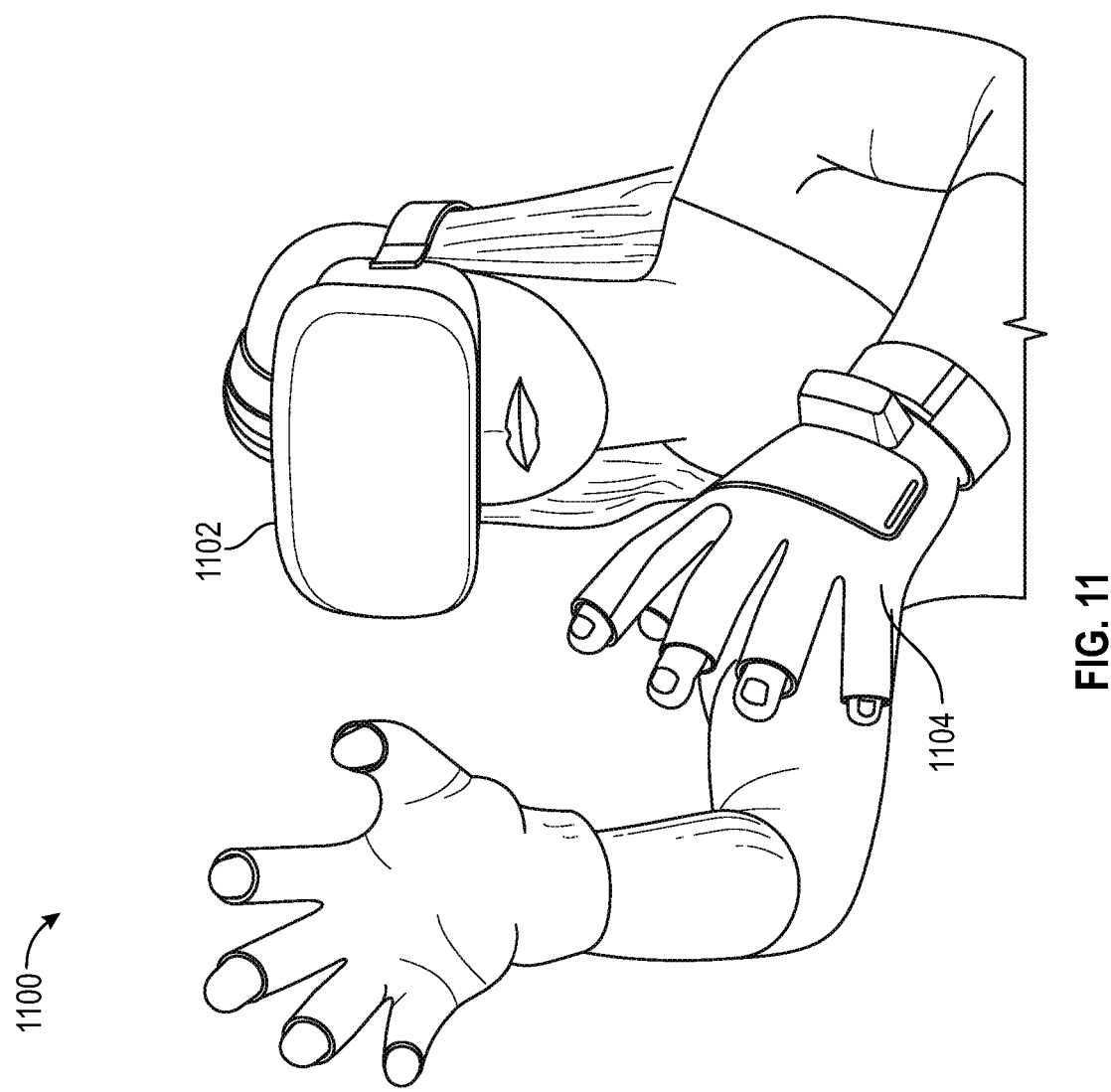
FIG. 11 is an illustration of an exemplary virtual-reality environment according to embodiments of this disclosure.

Haptic wearables, such as those shown in and described in connection with FIG. 10, may be implemented in a variety of types of artificial-reality systems and environments. FIG. 11 shows an example artificial-reality environment 1100 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Head-mounted display 1102 generally represents any type or form of virtual-reality system, such as virtual-reality system 900 in FIG. 9. Haptic device 1104 generally represents any type or form of wearable device, worn by a use of an artificial-reality system, that provides haptic feedback to the user to give the user the perception that he or she is physically engaging with a virtual object. In some embodiments, haptic device 1104 may provide haptic feedback by applying vibration, motion, and/or force to the user. For example, haptic device 1104 may limit or augment a user's movement. To give a specific example, haptic device 1104 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 1104 to send action requests to a console. Examples of action requests include, without limitation, requests to start an application and/or end the application and/or requests to perform a particular action within the application.

Figure 12:
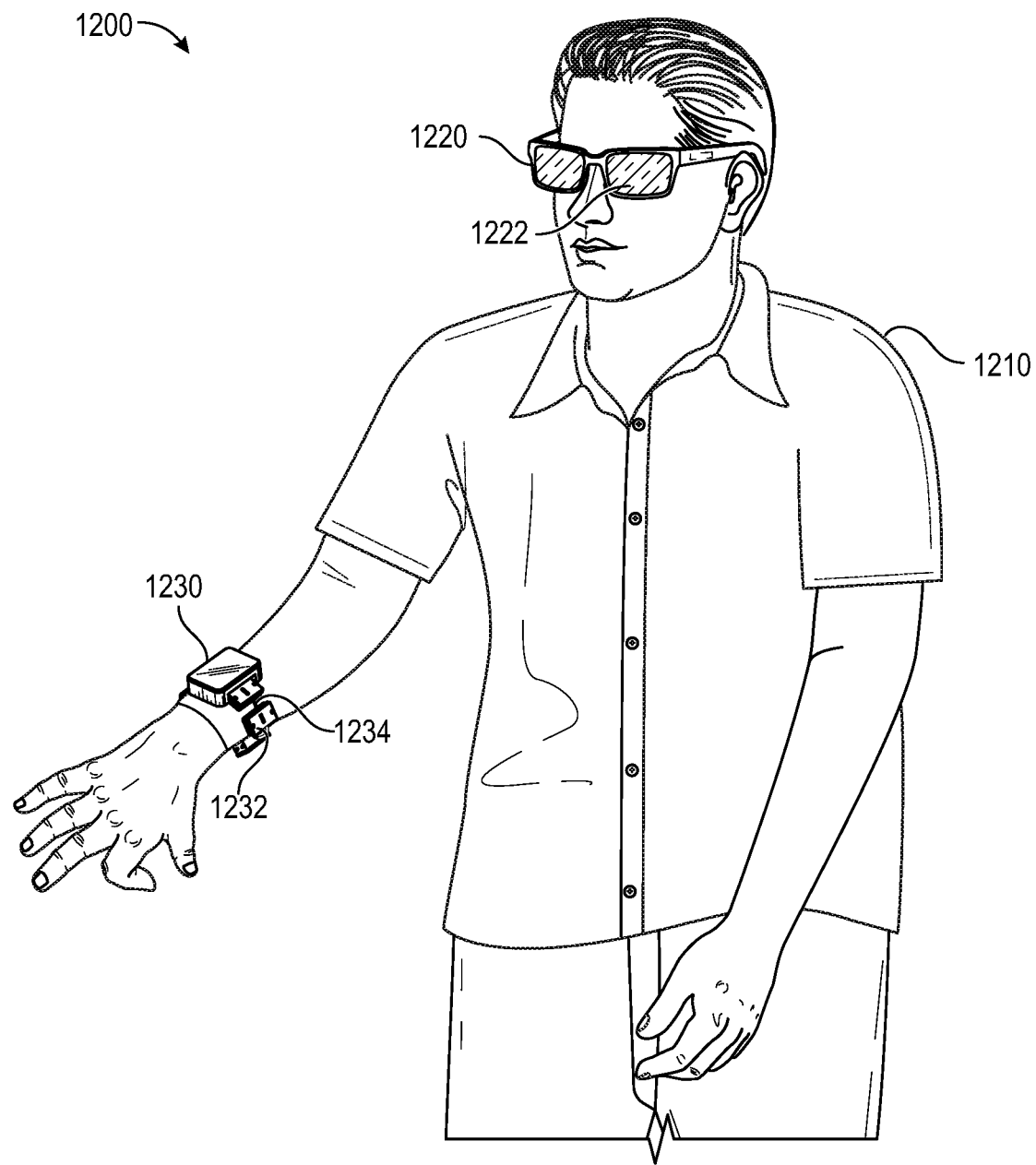
FIG. 12 is an illustration of an exemplary augmented-reality environment according to embodiments of this disclosure.

While haptic interfaces may be used with virtual-reality systems, as shown in FIG. 11, haptic interfaces may also be used with augmented-reality systems, as shown in FIG. 12. FIG. 12 is a perspective view a user 1210 interacting with an augmented-reality system 1200. In this example, user 1210 may wear a pair of augmented-reality glasses 1220 that have one or more displays 1222 and that are paired with a haptic device 1230. Haptic device 1230 may be a wristband that includes a plurality of band elements 1232 and a tensioning mechanism 1234 that connects band elements 1232 to one another.

One or more of band elements 1232 may include any type or form of actuator suitable for providing haptic feedback. For example, one or more of band elements 1232 may be configured to provide one or more of various types of cutaneous feedback, including vibration, force, traction, texture, and/or temperature. To provide such feedback, band elements 1232 may include one or more of various types of actuators. In some embodiments, an actuator may include a layer of nanovoided polymer sandwiched between conductive electrodes. In one example, each of band elements 1232 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1010, 1020, 1104, and 1230 may include any suitable number and/or type of haptic transducer, sensor, and/or feedback mechanism. For example, haptic devices 1010, 1020, 1104, and 1230 may include one or more mechanical transducers, piezoelectric transducers, and/or fluidic transducers. Haptic devices 1010, 1020, 1104, and 1230 may also include various combinations of different types and forms of transducers that work together or independently to enhance a user's artificial-reality experience. In one example, each of band elements 1232 of haptic device 1230 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An actuator assembly comprising:
   a first actuator stack comprising a first primary electrode, a first secondary electrode overlapping at least a portion of the first primary electrode, and a first electroactive layer disposed between and abutting the first primary electrode and the first secondary electrode;
   a second actuator stack comprising a second primary electrode, a second secondary electrode overlapping at least a portion of the second primary electrode, and a second electroactive layer disposed between and abutting the second primary electrode and the second secondary electrode;
   a bonding layer disposed between the first actuator stack and the second actuator stack; and
   a negative stiffness spring coupled to a single outer force surface of the first actuator stack or the second actuator stack, wherein the negative stiffness spring is anchored with a pair of fixed pivots and coupled to one of the first actuator stack or the second actuator stack via a linkage;
   wherein the first actuator stack is configured to expand and the second actuator stack is configured to contract simultaneously when a first voltage is applied to the first actuator stack and a second voltage is applied to the second actuator stack such that the bonding layer is displaced toward the second actuator stack.

2. The actuator assembly of claim 1, wherein a cross-sectional area of the first primary electrode is different than a cross-sectional area of the first secondary electrode.

3. The actuator assembly of claim 1, wherein the bonding layer comprises a matrix material and a thermally conductive material dispersed throughout the matrix material.

4. The actuator assembly of claim 1, wherein the bonding layer comprises particles or fibers of a metal or a ceramic.

5. The actuator assembly of claim 1, wherein the bonding layer abuts both an electroactive layer of the first actuator stack and an electroactive layer of the second actuator stack.

6. The actuator assembly of claim 1, further comprising a first primary contact layer disposed over an end face of the first primary electrode and a first secondary contact layer disposed over an end face of the first secondary electrode.

7. The actuator assembly of claim 6, wherein the first primary contact layer is disposed over an end face of the first electroactive layer and the first secondary contact layer disposed over an end face of the second electroactive layer.

8. The actuator assembly of claim 6, wherein a cross-sectional area of the first primary contact layer is different than a cross-sectional area of the first secondary contact layer.

9. The actuator assembly of claim 1, wherein the negative stiffness spring comprises at least one of:
   a pre-compressed spring;
   a non-linear spring;
   a pre-tensioned membrane; or
   a pre-bent beam.

10. The actuator assembly of claim 1, wherein the negative stiffness spring assists at least one of the first and second actuator stacks in expansion.

11. The actuator assembly of claim 1, wherein the negative stiffness spring assists at least one of the first and second actuator stacks in contraction.

12. A wearable device comprising:
   a flexible material dimensioned to be positioned against a body part of a wearer of the wearable device; and
   a structured actuator assembly that is coupled to the flexible material and that comprises:
      a first actuator stack comprising a first primary electrode, a first secondary electrode overlapping at least a portion of the first primary electrode, and a first electroactive layer disposed between and abutting the first primary electrode and the first secondary electrode;
      a second actuator stack comprising a second primary electrode, a second secondary electrode overlapping at least a portion of the second primary electrode, and a second electroactive layer disposed between and abutting the second primary electrode and the second secondary electrode;
      a bonding layer disposed between the first actuator stack and the second actuator stack; and
      a negative stiffness spring coupled to a single outer force surface of the structured actuator assembly, wherein the negative stiffness spring is anchored with a pair of fixed pivots and coupled to one of the first actuator stack or the second actuator stack via a linkage;
   wherein the first actuator stack is configured to expand and the second actuator stack is configured to contract simultaneously when a first voltage is applied to the first actuator stack and a second voltage is applied to the second actuator stack such that the bonding layer is displaced toward the second actuator stack.

13. The wearable device of claim 12, further comprising an optical assembly, wherein the structured actuator assembly is coupled to the optical assembly in a manner that enables the structured actuator assembly to actuate a deformable optical element of the optical assembly.

14. The wearable device of claim 13, wherein the optical assembly comprises a lens assembly.

15. The wearable device of claim 14, wherein the optical assembly is part of at least one of a virtual reality headset or an augmented reality headset.

16. The wearable device of claim 12, further comprising a wristband, wherein the structured actuator assembly is coupled to the wristband in a manner that enables the structured actuator assembly to provide haptic feedback to a user of the wristband.

17. The wearable device of claim 12, wherein a force of the negative stiffness spring is larger than, and in opposition to, a force of the structured actuator assembly in a manner that causes the structured actuator assembly to be at least bi-stable.

18. The wearable device of claim 12, wherein the flexible material and the structured actuator assembly comprise a haptic interface that:
   receives signals from an artificial reality device; and
   provides haptic feedback to the wearer of the wearable device in a manner that gives the wearer a perception that the wearer is engaging with a virtual object.

* * * * *